US012796416B2

(12) United States Patent
Chiu et al.

(10) Patent No.: US 12,796,416 B2
(45) Date of Patent: Nov. 10, 2026

(54) SEMICONDUCTOR DEVICE STRUCTURE WITH GATE SPACER AND METHOD FOR FORMING THE SAME

(71) Applicant: Taiwan Semiconductor Manufacturing Company, Ltd., Hsinchu (TW)

(72) Inventors: Wen-Li Chiu, Kaohsiung City (TW); Chia-Hao Kuo, Taoyuan City (TW); Fu-Hsiang Su, Zhubei city (TW); Shih-Hsun Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 588 days.

(21) Appl. No.: 18/449,198

(22) Filed: Aug. 14, 2023

(65) Prior Publication Data

US 2025/0062158 A1 Feb. 20, 2025

(51) Int. Cl.

| | |
|---|---|
| ***H10W 10/17*** | (2026.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/23*** | (2025.01) |
| ***H10W 10/00*** | (2026.01) |

(52) U.S. Cl.

CPC .......... *H10W 10/17* (2026.01); *H10D 30/014* (2025.01); *H10D 30/43* (2025.01); *H10D 30/6735* (2025.01); *H10D 62/121* (2025.01); *H10D 64/258* (2025.01); *H10W 10/0145* (2026.01)

(58) Field of Classification Search

CPC .... H10D 30/014; H10D 30/019; H10D 30/43; H10D 30/501; H10D 30/6735; H10D 30/6757; H10D 62/116; H10D 62/121; H10D 64/017; H10D 64/258; H10D 84/0151; H10D 84/0153; H10D 84/832; H10W 10/0145; H10W 10/17

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |

(Continued)

*Primary Examiner* — Scott B Geyer

(74) *Attorney, Agent, or Firm* — Birch, Stewart, Kolasch & Birch, LLP

(57) ABSTRACT

A method for forming a semiconductor device structure is provided. The method includes providing a substrate having a base and a fin over the base. The method includes forming a first gate stack wrapped around the fin. The method includes forming a first gate spacer over a first sidewall of the first gate stack. The method includes partially removing the fin, which is not covered by the first gate stack and the first gate spacer. The method includes removing a first upper portion of the first gate stack to expose a second upper portion of the first gate spacer. The method includes removing the second upper portion of the first gate spacer. The method includes removing a first lower portion of the first gate stack and the fin originally wrapped by the first gate stack. The method includes forming a dielectric channel-cut structure in the trench.

20 Claims, 33 Drawing Sheets

(56) References Cited

U.S. PATENT DOCUMENTS

| | | | | |
|---|---|---|---|---|
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2020/0294863 | A1* | 9/2020 | Chiang | B82Y 10/00 |
| 2020/0312956 | A1* | 10/2020 | Yeh | B82Y 10/00 |
| 2022/0301922 | A1* | 9/2022 | Huang | H10D 30/014 |
| 2023/0014468 | A1* | 1/2023 | Park | H10D 30/014 |

* cited by examiner

SEMICONDUCTOR DEVICE STRUCTURE WITH GATE SPACER AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1 to 1B-1 are perspective views of the semiconductor device structure of FIGS. 1A-1B, in accordance with some embodiments.

FIG. 2D-1 is a top view of the semiconductor device structure of FIG. 2D, in accordance with some embodiments.

FIG. 2E-1 is a top view of the semiconductor device structure of FIG. 2E, in accordance with some embodiments.

FIG. 2E-2 is a cross-sectional view illustrating the semiconductor device structure along a sectional line II-II' in FIG. 2E-1, in accordance with some embodiments.

FIG. 2F-1 is a top view of the semiconductor device structure of FIG. 2F, in accordance with some embodiments.

FIG. 2O-1 is a top view of the semiconductor device structure of FIG. 2O, in accordance with some embodiments.

FIG. 2P-1 is a top view of the semiconductor device structure of FIG. 2P, in accordance with some embodiments.

FIG. 2P-2 is a cross-sectional view illustrating the semiconductor device structure along a sectional line II-II' in FIG. 2P-1, in accordance with some embodiments.

DETAILED DESCRIPTION

Figure 1A:
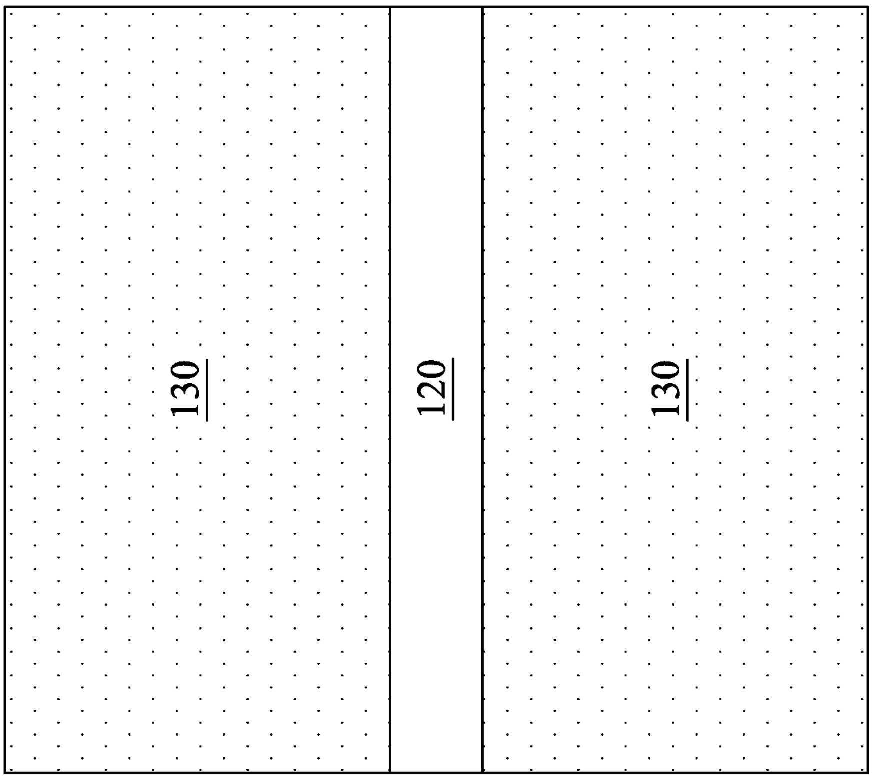
FIGS. 1A-1B are top views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term “substantially” in the description, such as in “substantially flat” or in “substantially coplanar”, etc., will be understood by the person skilled in the art. In some embodiments the adjective substantially may be removed. Where applicable, the term “substantially” may also include embodiments with “entirely”, “completely”, “all”, etc. The term “substantially” may be varied in different technologies and be in the deviation range understood by the skilled in the art. For example, the term “substantially” may also relate to 90% of what is specified or higher, such as 95% of what is specified or higher, especially 99% of what is specified or higher, including 100% of what is specified, though the present invention is not limited thereto. Furthermore, terms such as “substantially parallel” or “substantially perpendicular” may be interpreted as not to exclude insignificant deviation from the specified arrangement and may include for example deviations of up to 10°. The word “substantially” does not exclude “completely” e.g. a composition which is “substantially free” from Y may be completely free from Y.

The term “about” may be varied in different technologies and be in the deviation range understood by the skilled in the art. The term “about” in conjunction with a specific distance or size is to be interpreted so as not to exclude insignificant deviation from the specified distance or size. For example, the term “about” may include deviations of up to 10% of what is specified, though the present invention is not limited thereto. The term “about” in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Source/drain structure(s) may refer to a source or a drain, individually or collectively dependent upon the context.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figures 1, 1A:
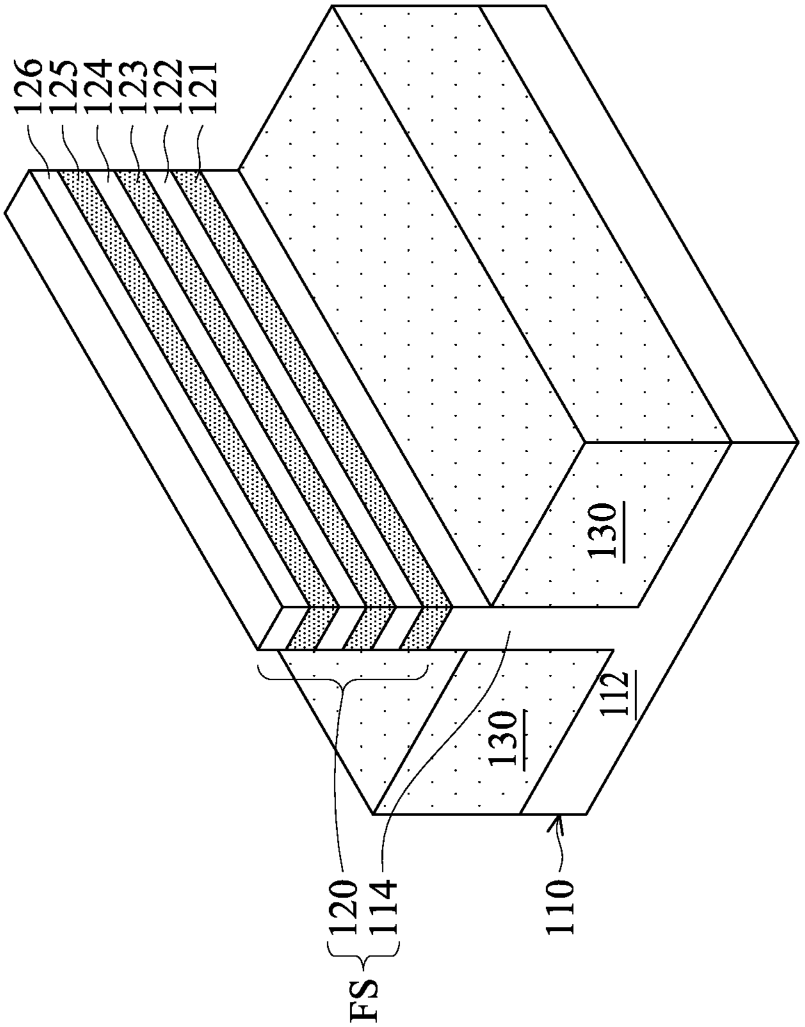
Figure 1B:
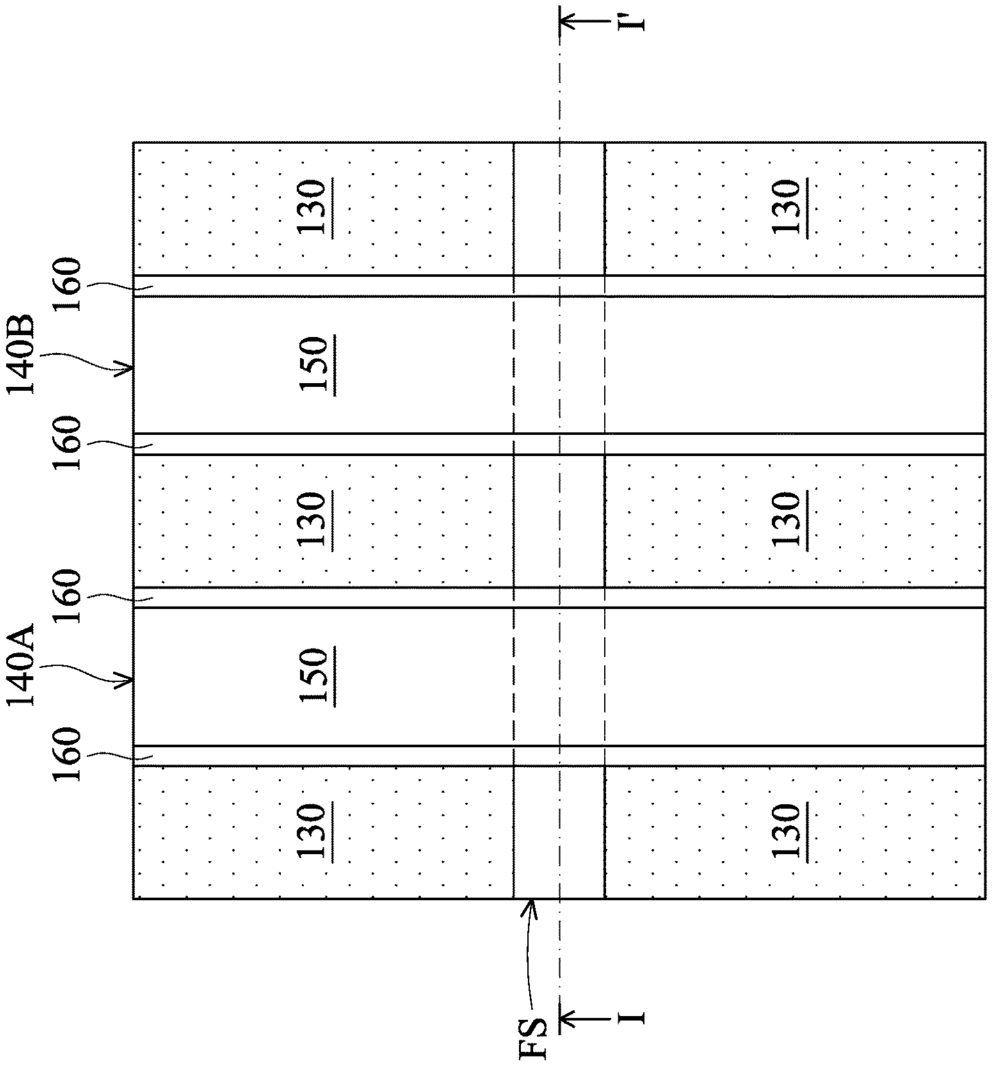
Figures 1, 1B:
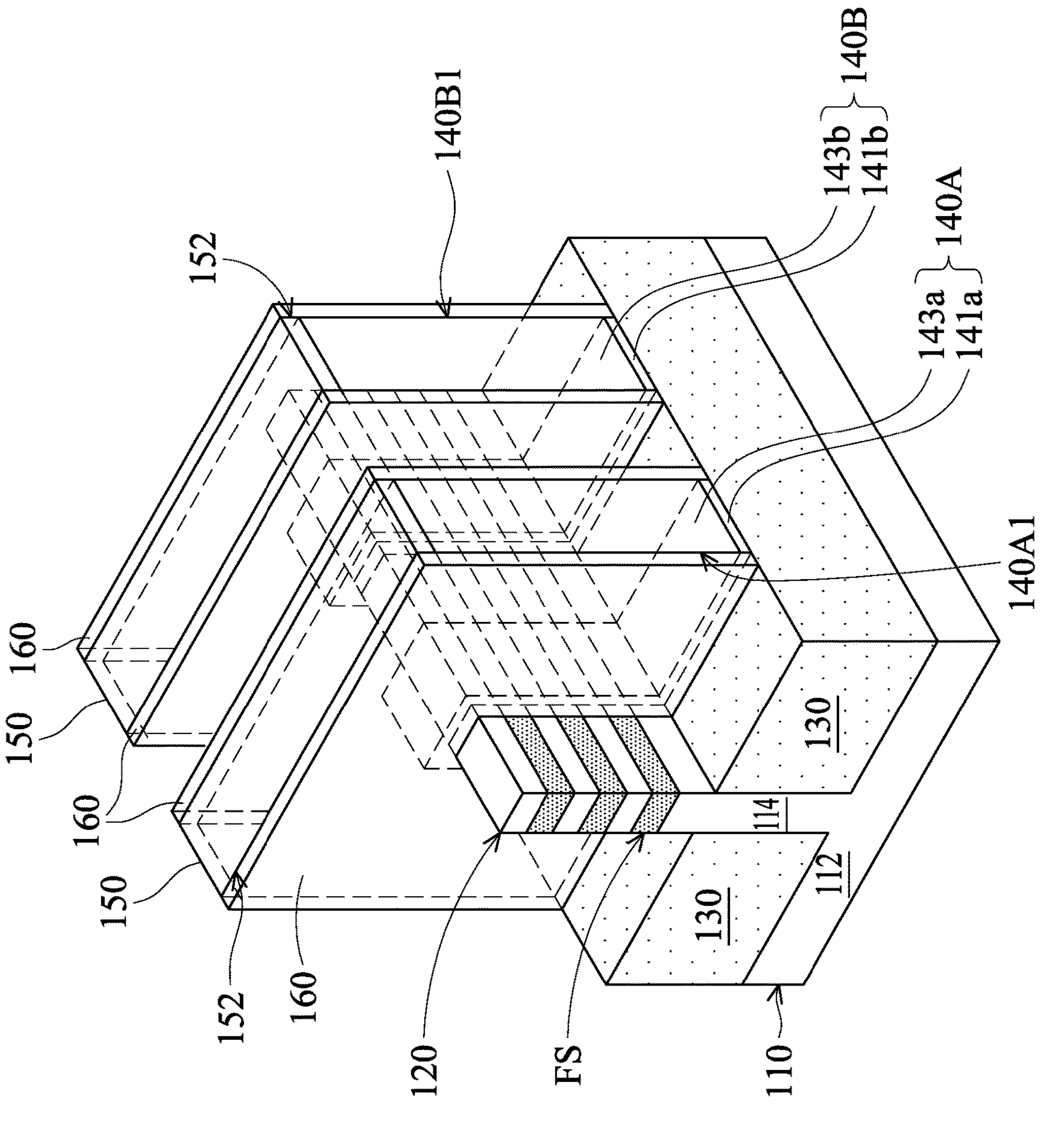

FIGS. 1A-1B are top views of various stages of a process for forming a semiconductor device structure, in accordance with some embodiments. FIGS. 1A-1 to 1B-1 are perspective views of the semiconductor device structure of FIGS. 1A-1B, in accordance with some embodiments.

As shown in FIGS. 1A and 1A-1, a substrate 110 is provided, in accordance with some embodiments. The substrate 110 has a base 112 and a fin 114 over the base 112, in accordance with some embodiments.

The substrate 110 includes, for example, a semiconductor substrate. The substrate 110 includes, for example, a semiconductor wafer (such as a silicon wafer) or a portion of a semiconductor wafer. In some embodiments, the substrate 110 is made of an elementary semiconductor material including silicon or germanium in a single crystal structure, a polycrystal structure, or an amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity.

Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, a nanostructure stack 120 is formed over the fin 114, in accordance with some embodiments. The nanostructure stack 120 and the fin 114 together form a fin structure FS, in accordance with some embodiments.

The nanostructure stack 120 includes nanostructures 121, 122, 123, 124, 125, and 126, in accordance with some embodiments. The nanostructures 121, 122, 123, 124, 125, and 126 are sequentially stacked over the fin 114, in accordance with some embodiments. The nanostructures 121, 122, 123, 124, 125, and 126 include nanowires or nanosheets, in accordance with some embodiments.

The nanostructures 121, 123, and 125 are all made of the same first material, in accordance with some embodiments. The first material is different from the material of the substrate 110, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

The nanostructures 122, 124, and 126 are all made of the same second material, in accordance with some embodiments. The second material is different from the first material, in accordance with some embodiments. The second material is the same as the material of the substrate 110, in accordance with some embodiments. The second material includes an elementary semiconductor material including silicon or germanium in a single crystal structure, a polycrystal structure, or an amorphous structure, in accordance with some embodiments.

The second material includes a compound semiconductor, an alloy semiconductor, or a combination thereof, in accordance with some embodiments. The compound semiconductor includes silicon carbide, gallium arsenide, gallium phosphide, indium phosphide, indium arsenide, a combination thereof, or another suitable compound semiconductor material, in accordance with some embodiments. The alloy semiconductor includes SiGe, SiGeSn, SiGeC, SiSn, GaAsP, GeSn, a combination thereof, or another suitable alloy semiconductor material, in accordance with some embodiments.

As shown in FIG. 1A, an isolation layer 130 is formed over the base 112, in accordance with some embodiments. The fin 114 is partially embedded in the isolation layer 130, in accordance with some embodiments. The fin 114 is surrounded by the isolation layer 130, in accordance with some embodiments.

The isolation layer 130 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 130 is formed using a deposition process (or a spin-on process), a chemical mechanical polishing process, and an etching back process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

Figure 2A:
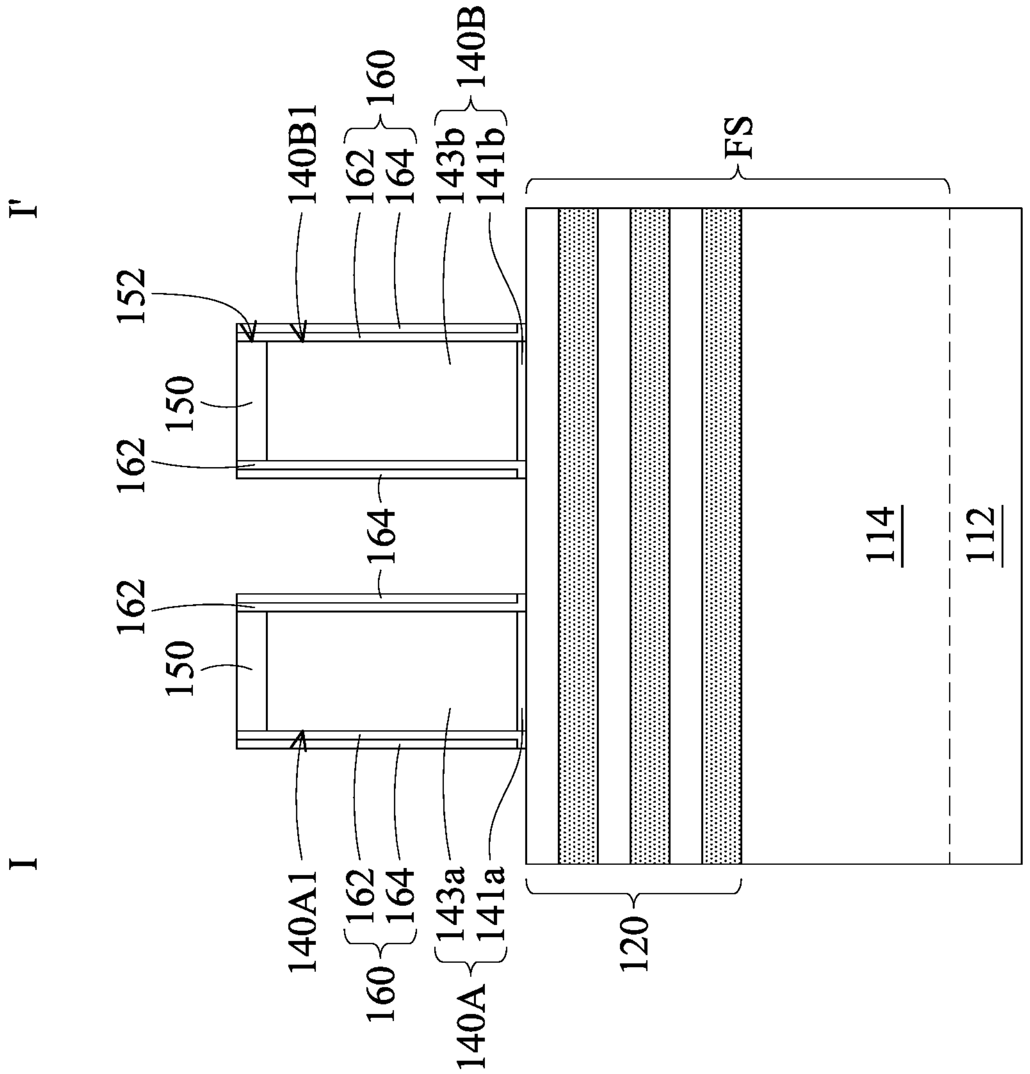
FIGS. 2A-2P are cross-sectional views of various stages of a process for forming a semiconductor device structure, in accordance with some embodiments.

FIG. 2A is a cross-sectional view illustrating the semiconductor device structure along a sectional line I-I' in FIG. 1B, in accordance with some embodiments. As shown in FIGS. 1B, 1B-1, and 2A, gate stacks 140A and 140B and a mask layer 150 are formed over the nanostructure stack 120, the fin 114, and the isolation layer 130, in accordance with some embodiments.

The gate stack 140A includes a gate dielectric layer 141*a* and a gate electrode 143*a*, in accordance with some embodiments. The gate electrode 143*a* is over the gate dielectric layer 141*a*, in accordance with some embodiments. The gate dielectric layer 141*a* is positioned between the gate electrode 143*a* and the nanostructure stack 120, in accordance with some embodiments.

The gate dielectric layer 141*a* is also positioned between the gate electrode 143*a* and the fin 114, in accordance with some embodiments. The gate dielectric layer 141*a* is positioned between the gate electrode 143*a* and the isolation layer 130, in accordance with some embodiments.

The gate dielectric layer 141*a* is made of an oxide-containing material such as silicon oxide, in accordance with some embodiments. The gate dielectric layer 141*a* is formed using a chemical vapor deposition process and an etching process, in accordance with some embodiments.

The gate electrode 143*a* is made of a semiconductor material such as polysilicon, in accordance with some embodiments. The gate electrode 143*a* is formed using a chemical vapor deposition process and an etching process, in accordance with some embodiments.

The gate stack 140B includes a gate dielectric layer 141*b* and a gate electrode 143*b*, in accordance with some embodiments. The gate electrode 143*b* is over the gate dielectric layer 141*b*, in accordance with some embodiments. The gate dielectric layer 141*b* is positioned between the gate electrode 143*b* and the nanostructure stack 120, in accordance with some embodiments.

The gate dielectric layer 141*b* is also positioned between the gate electrode 143*b* and the fin 114, in accordance with some embodiments. The gate dielectric layer 141*b* is positioned between the gate electrode 143*b* and the isolation layer 130, in accordance with some embodiments.

The gate dielectric layer 141*b* is made of an oxide-containing material such as silicon oxide, in accordance with some embodiments. The gate dielectric layer 141*b* is formed using a chemical vapor deposition process and an etching process, in accordance with some embodiments.

The gate electrode 143*b* is made of a semiconductor material such as polysilicon, in accordance with some embodiments. The gate electrode 143*b* is formed using a chemical vapor deposition process and an etching process, in accordance with some embodiments.

The mask layer 150 is positioned over the gate stacks 140A and 140B, in accordance with some embodiments. The mask layer 150 is made of a different material than the gate stacks 140A and 140B, in accordance with some embodiments. The mask layer 150 is made of nitrides (e.g., silicon nitride) or oxynitride (e.g., silicon oxynitride), in accordance with some embodiments.

As shown in FIGS. 1B, 1B-1, and 2A, a gate spacer 160 is formed over sidewalls 140A1, 140B1, and 152 of the gate stacks 140A and 140B and the mask layer 150, in accordance with some embodiments. The gate spacer 160 surrounds the gate stacks 140A and 140B and the mask layer 150, in accordance with some embodiments. The gate spacer 160 is positioned over the fin structure FS and the isolation layer 130, in accordance with some embodiments.

In some embodiments, the gate spacer 160 includes layers 162 and 164. The layer 162 conformally covers the fin structure FS and the sidewalls 140A1, 140B1, and 152 of the gate stacks 140A and 140B and the mask layer 150, in accordance with some embodiments. The layer 164 is over the layer 162, in accordance with some embodiments.

The layers 162 and 164 are made of different materials, in accordance with some embodiments. The etch resistance of the layer 164 is greater than that of the layer 162, in accordance with some embodiments. The dielectric constant of the layer 164 is greater than that of the layer 162, in accordance with some embodiments.

The gate spacer 160 includes an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

The gate spacer 160 is made of a material different from that of the gate stacks 140A and 140B and the mask layer 150, in accordance with some embodiments. The formation of the gate spacer 160 includes deposition processes and an anisotropic etching process, in accordance with some embodiments.

Figure 2B:
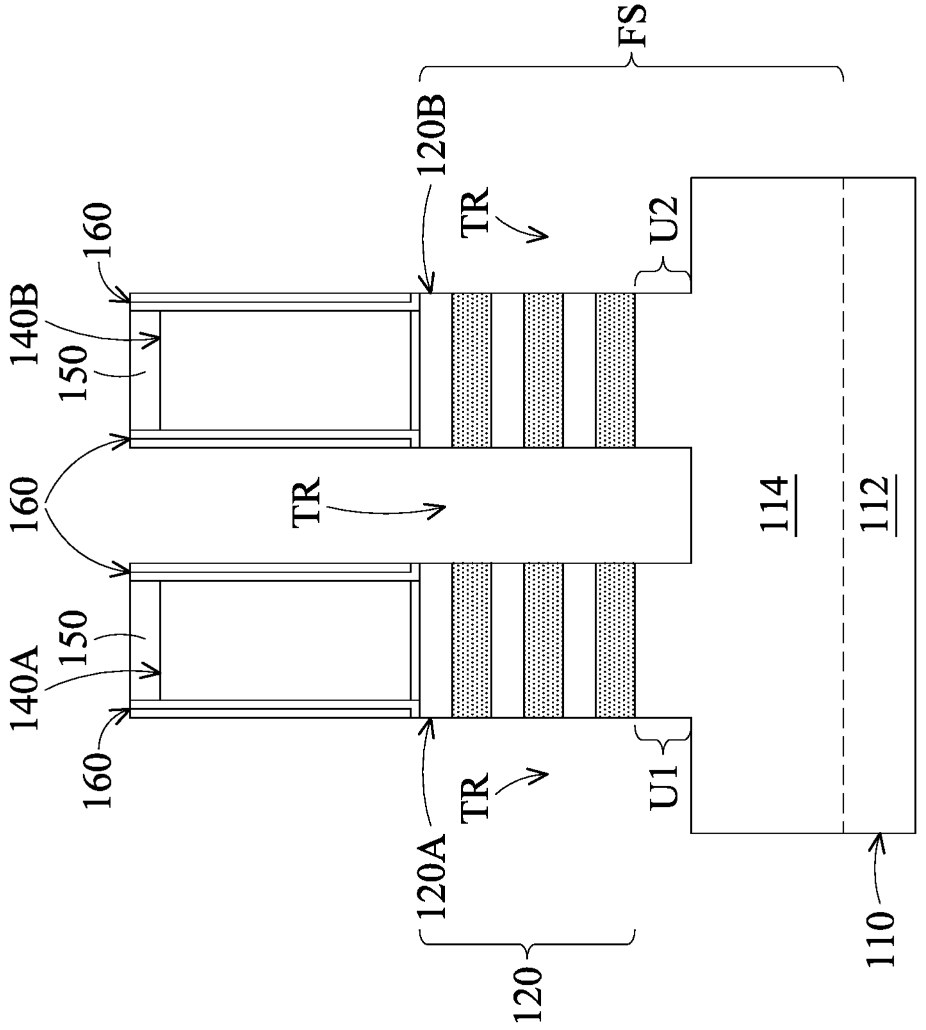
Figure 2C:
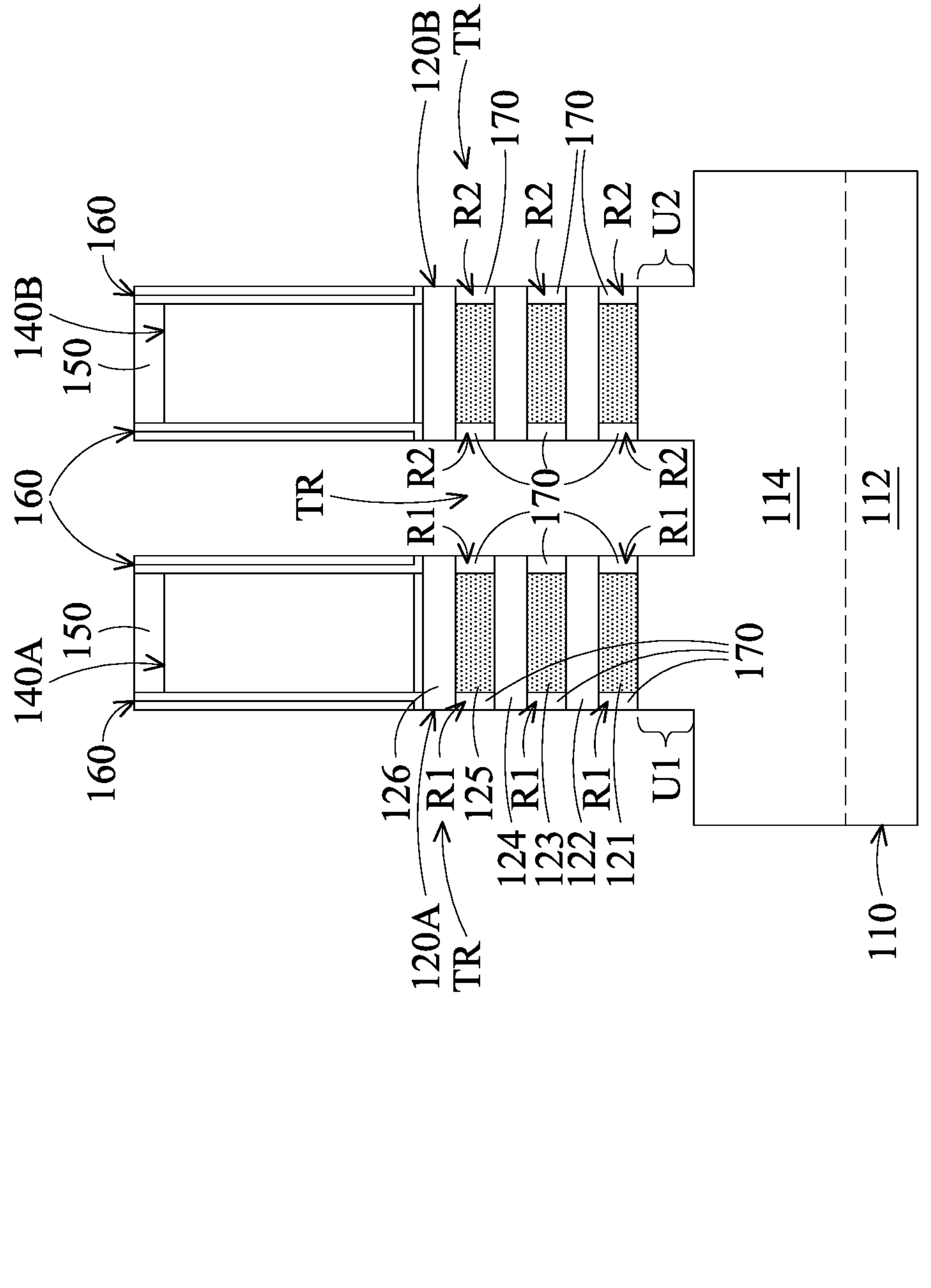
Figure 2D:
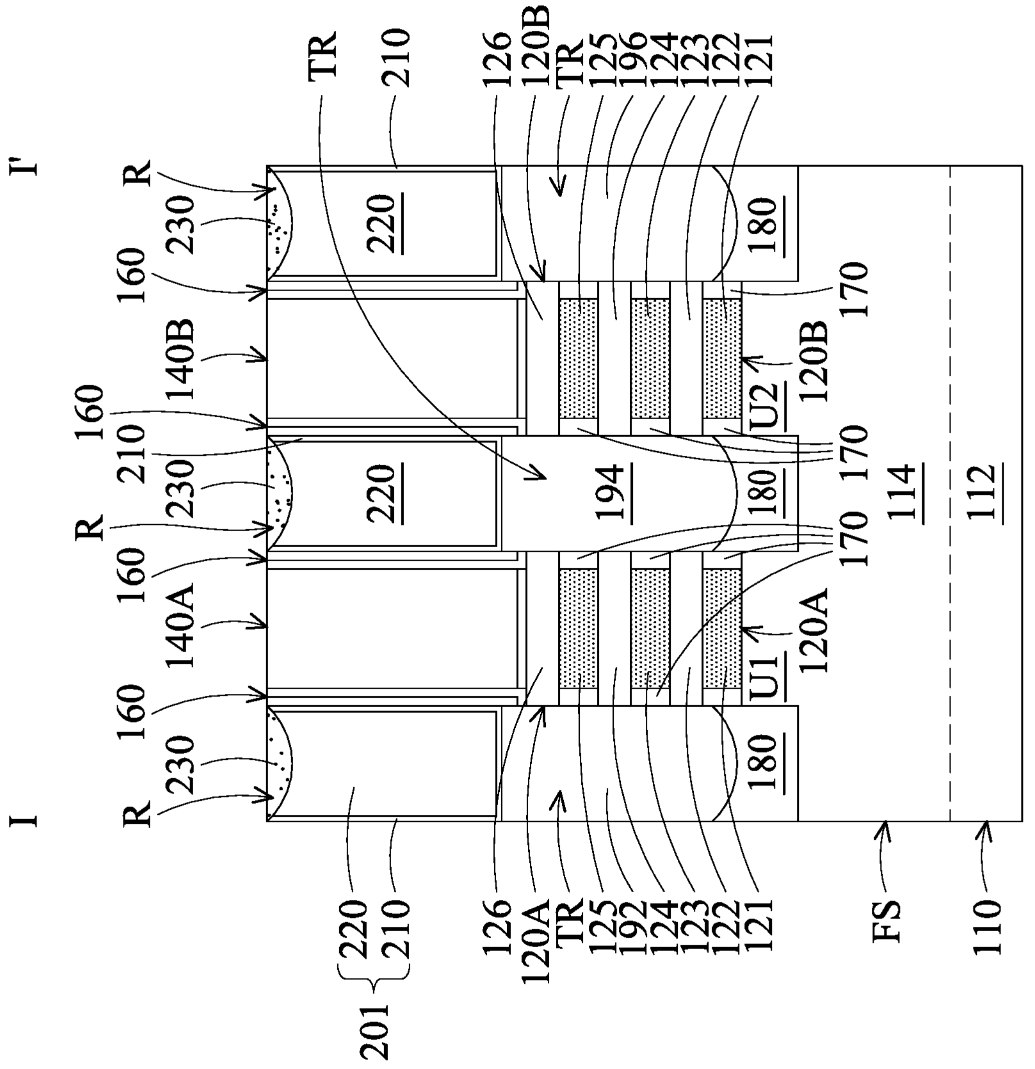
Figures 1, 2D:
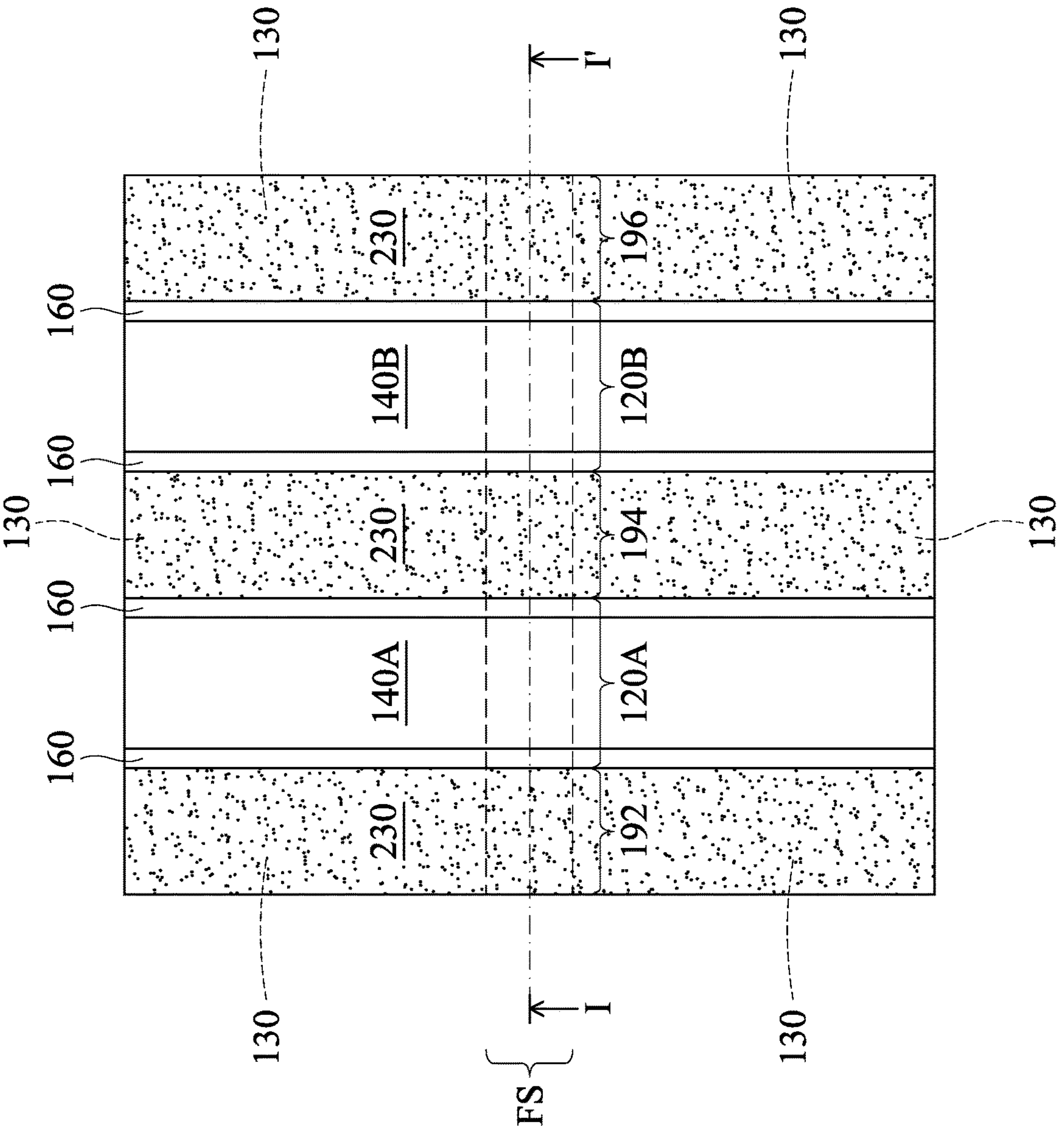
Figure 2E:
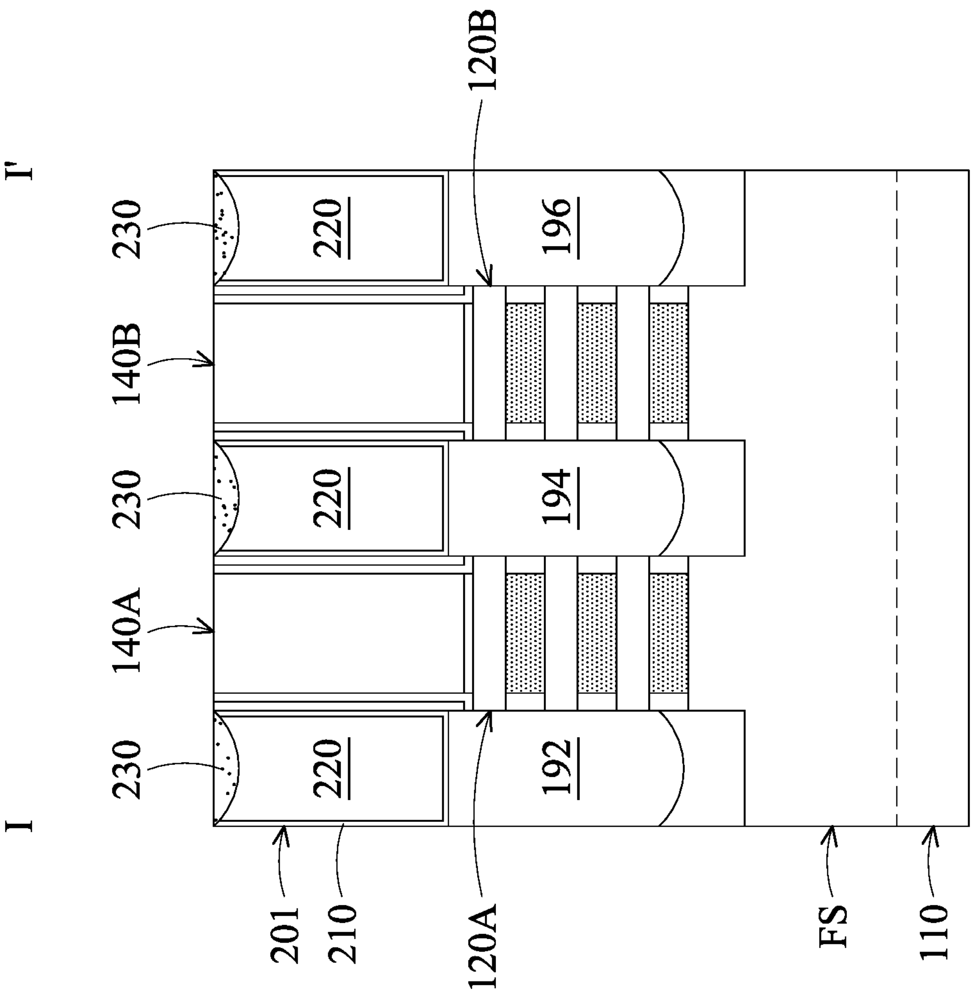
Figures 1, 2E:
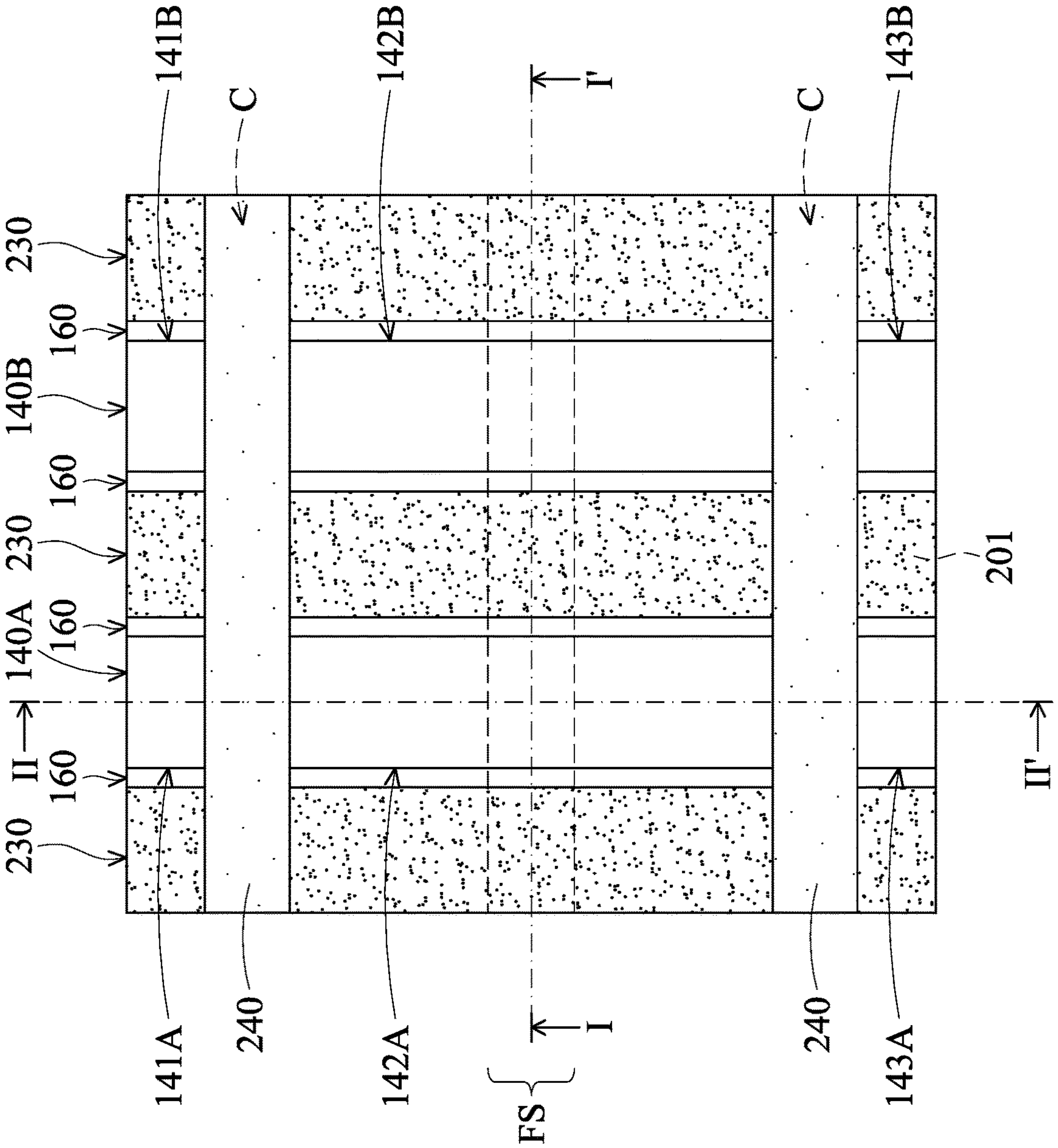
Figures 2, 2E:
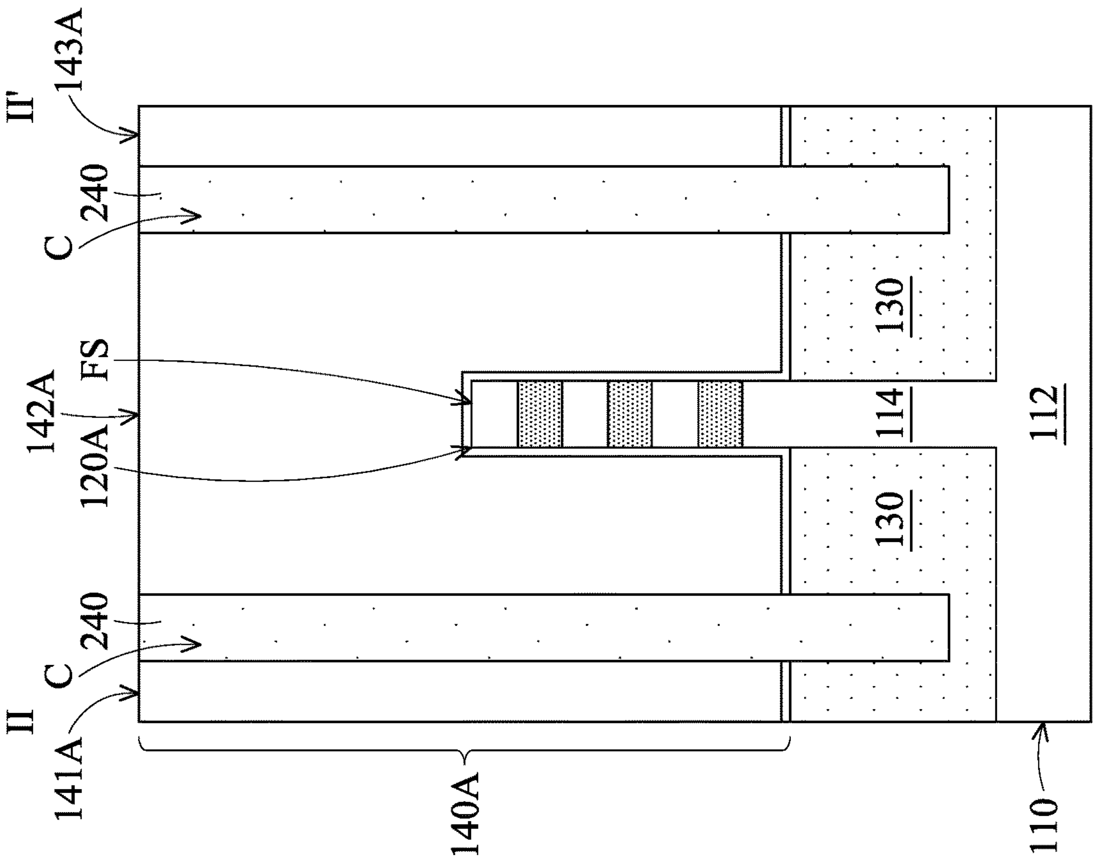
Figure 2F:
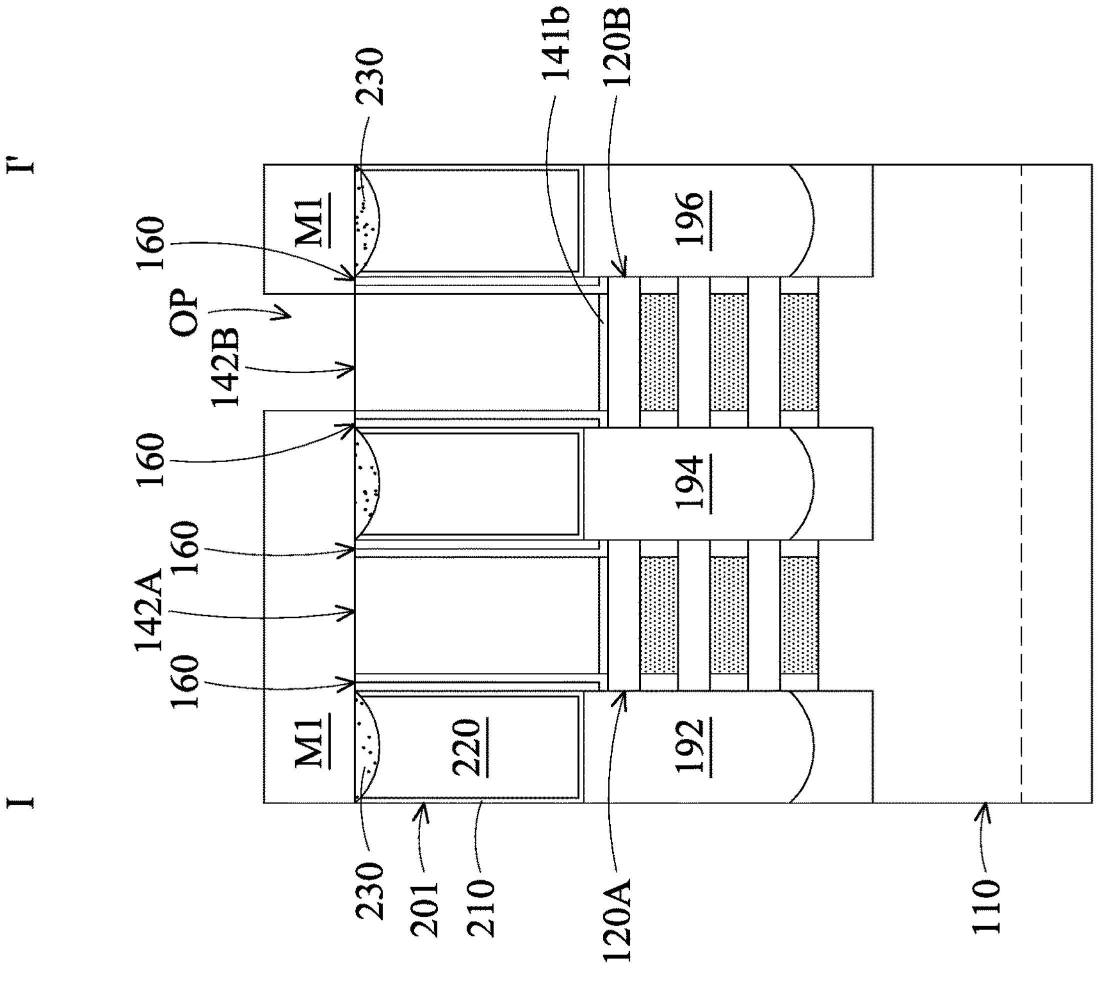
Figures 1, 2F:
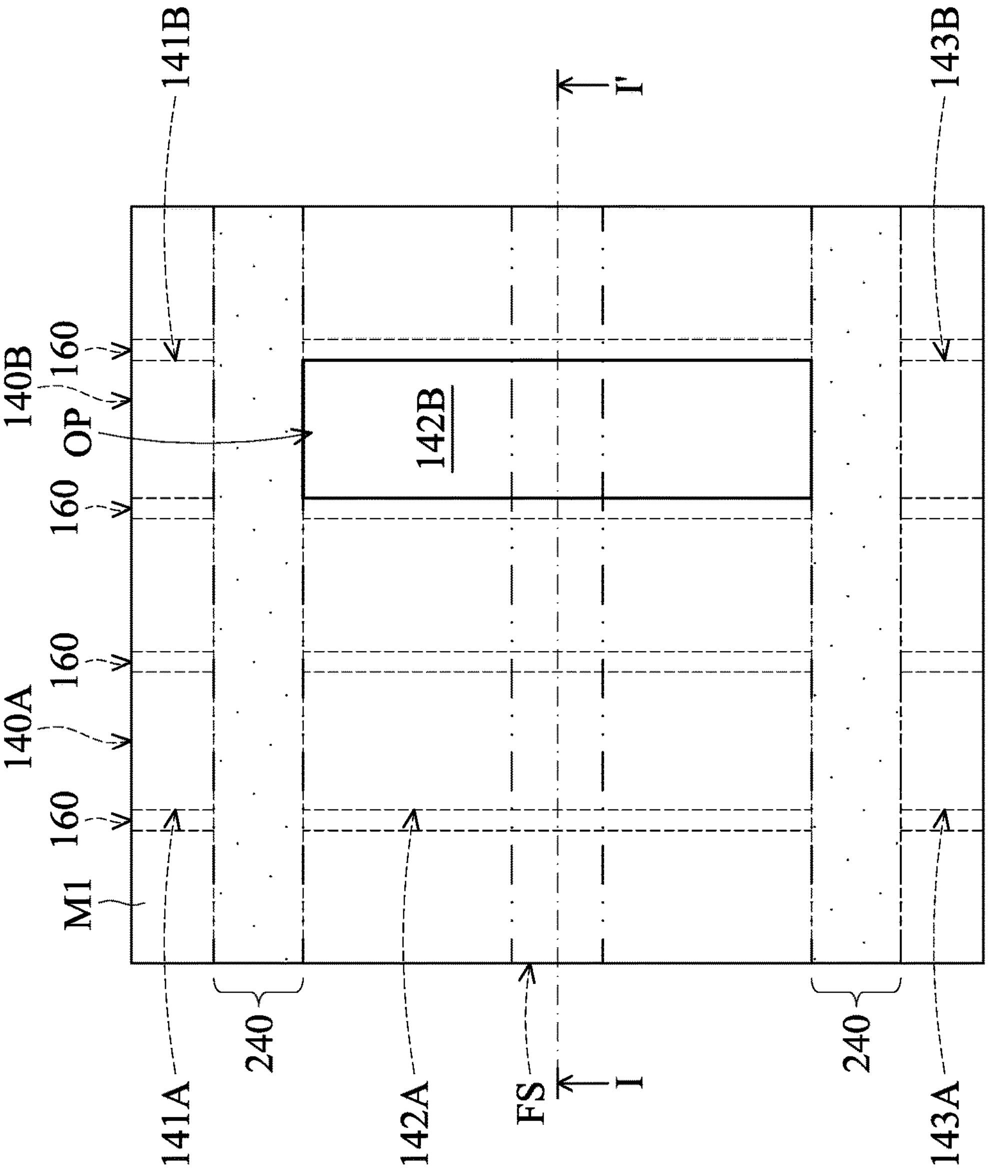
Figure 2G:
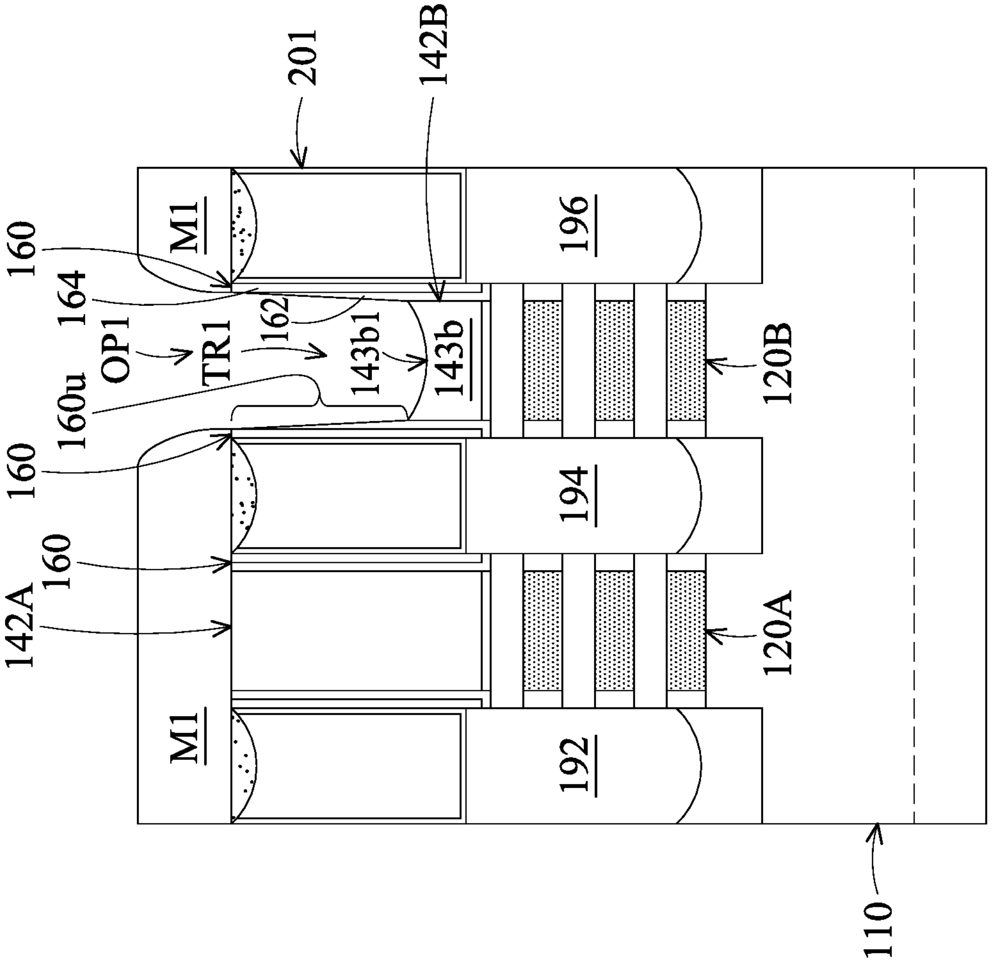
Figure 2H:
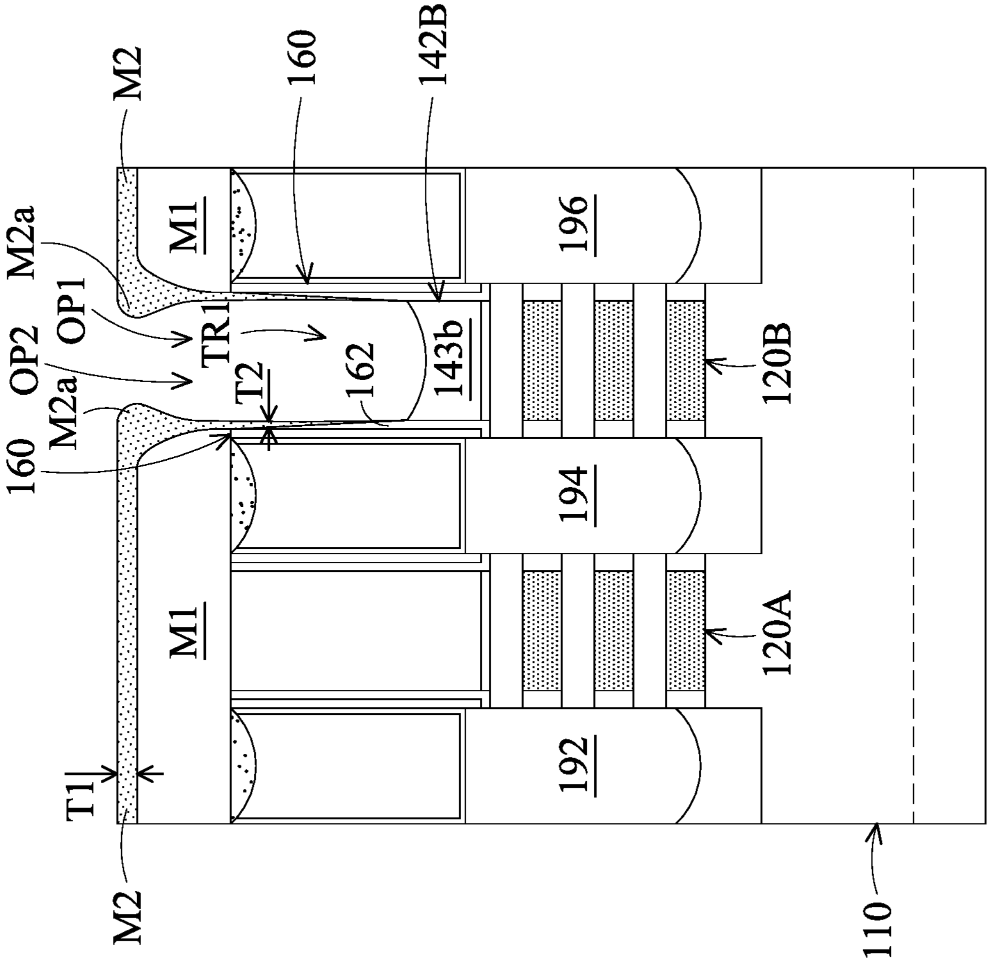
Figure 2I:
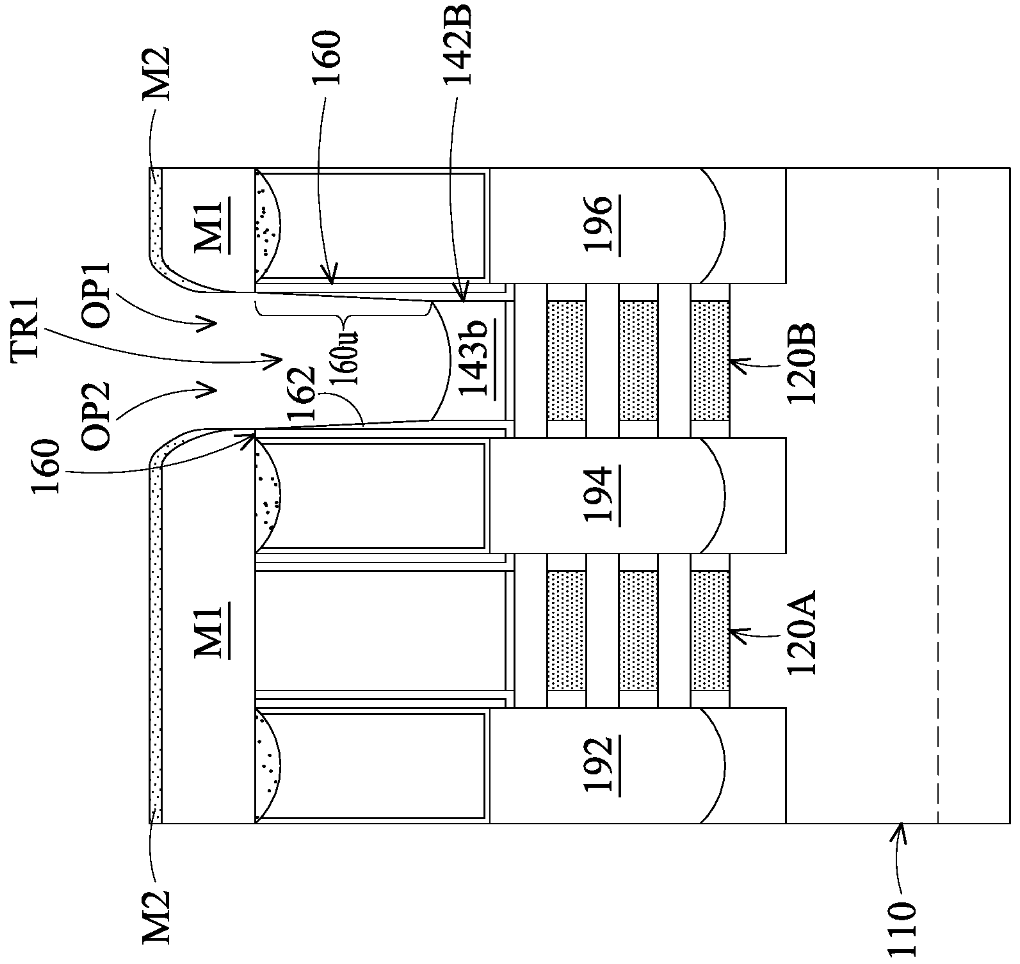
Figure 2J:
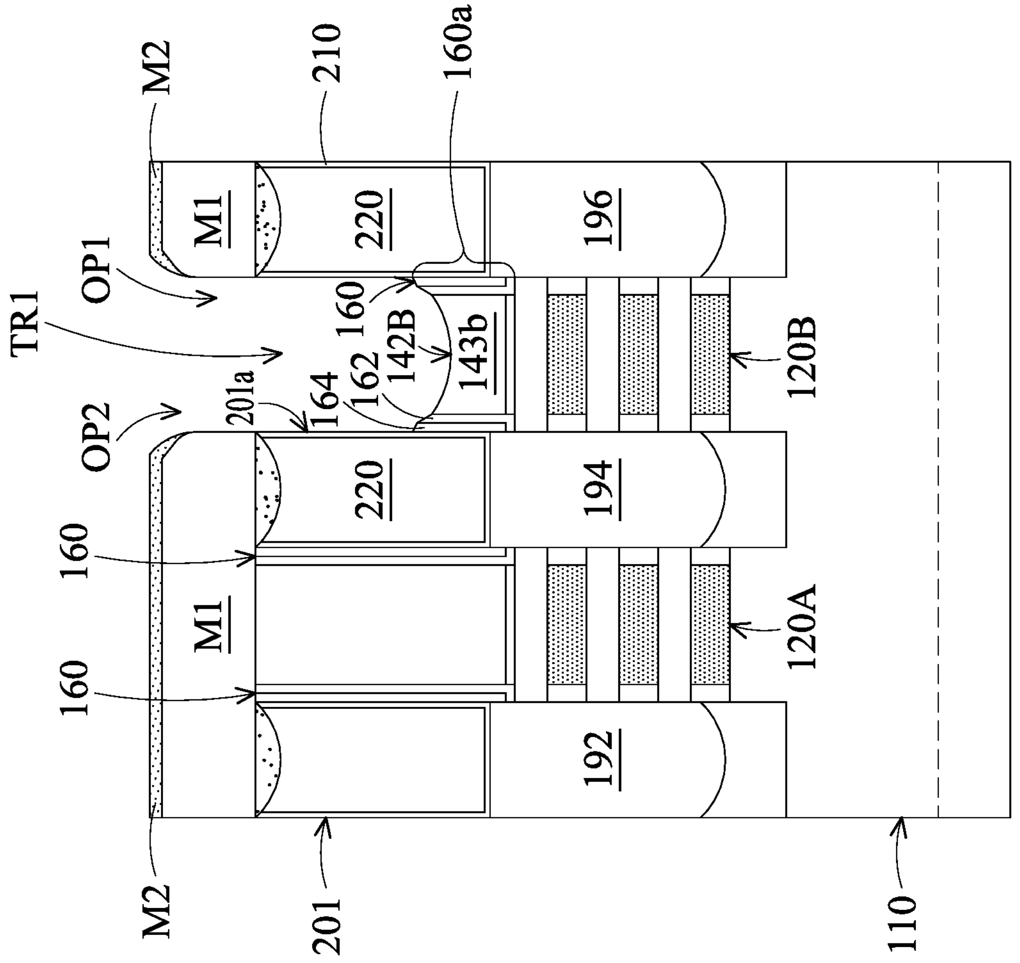
Figure 2K:
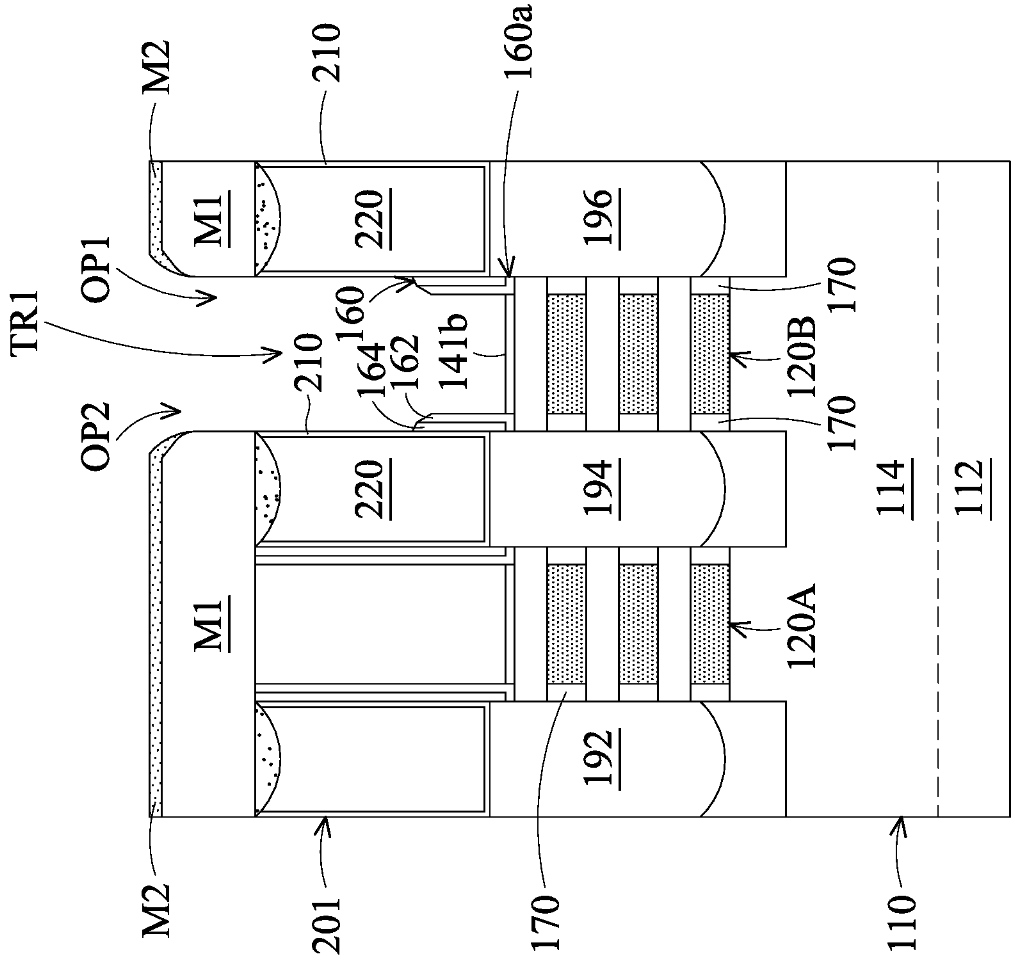
Figure 2L:
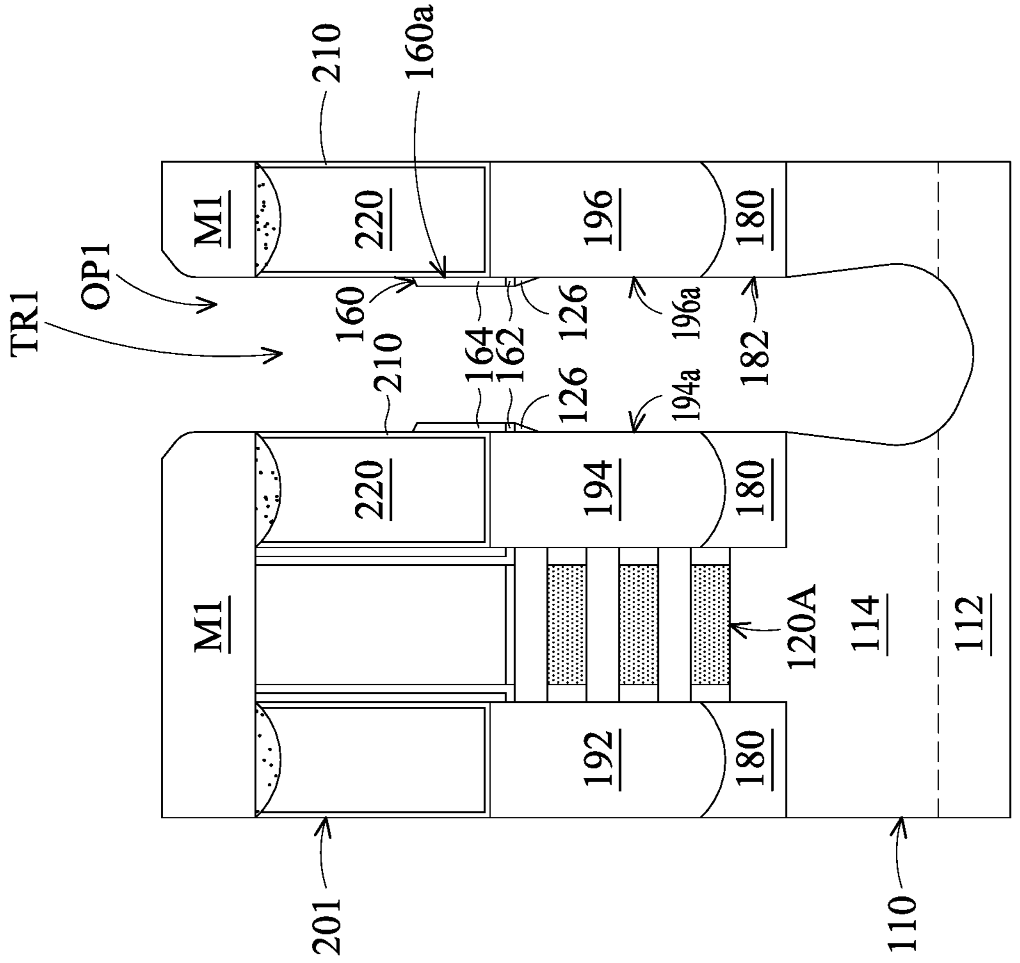
Figure 2M:
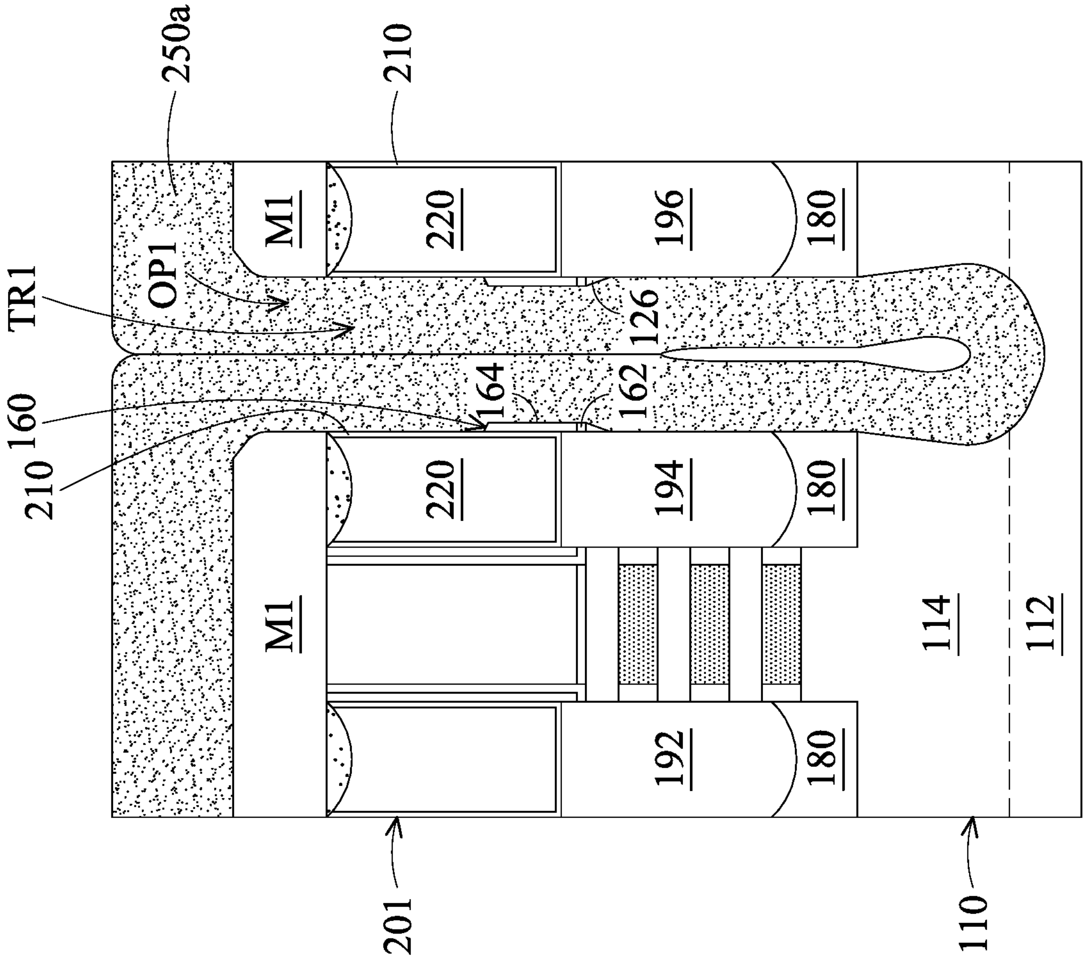
Figure 2N:
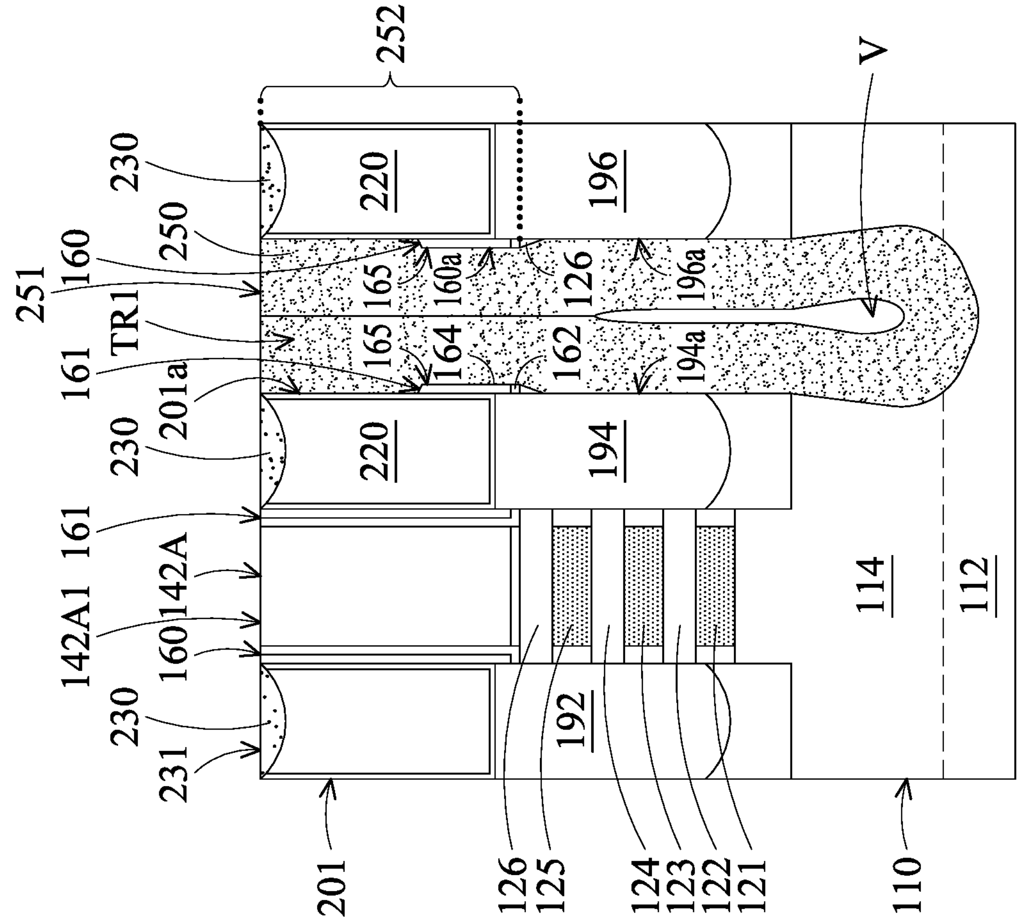
Figure 2O:
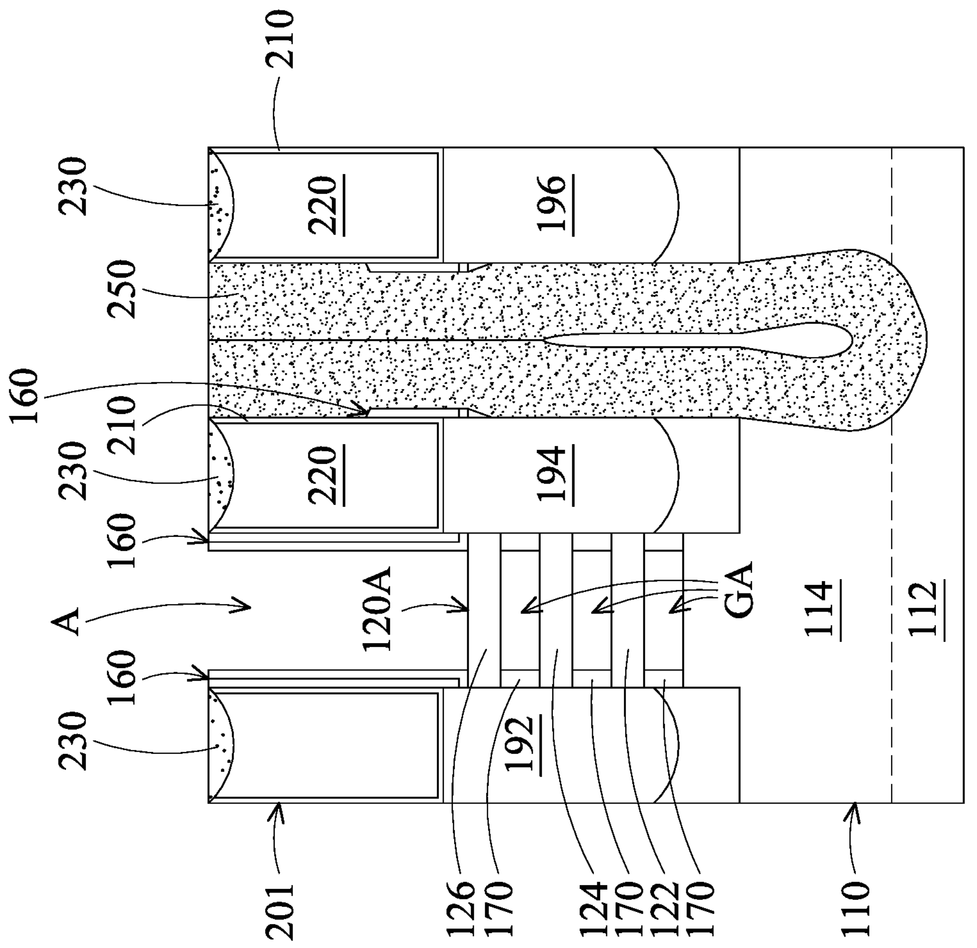
Figures 1, 2O:
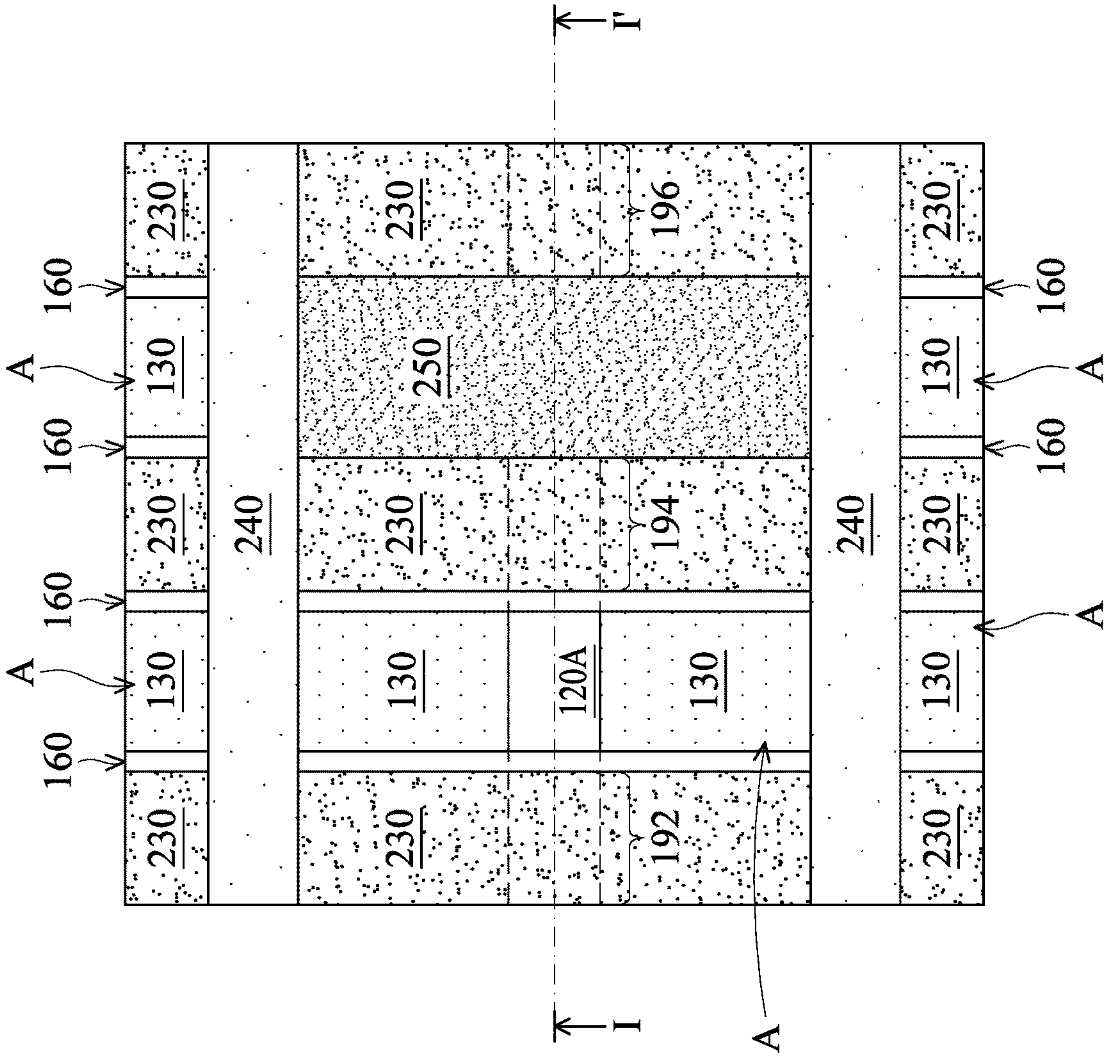
Figure 2P:
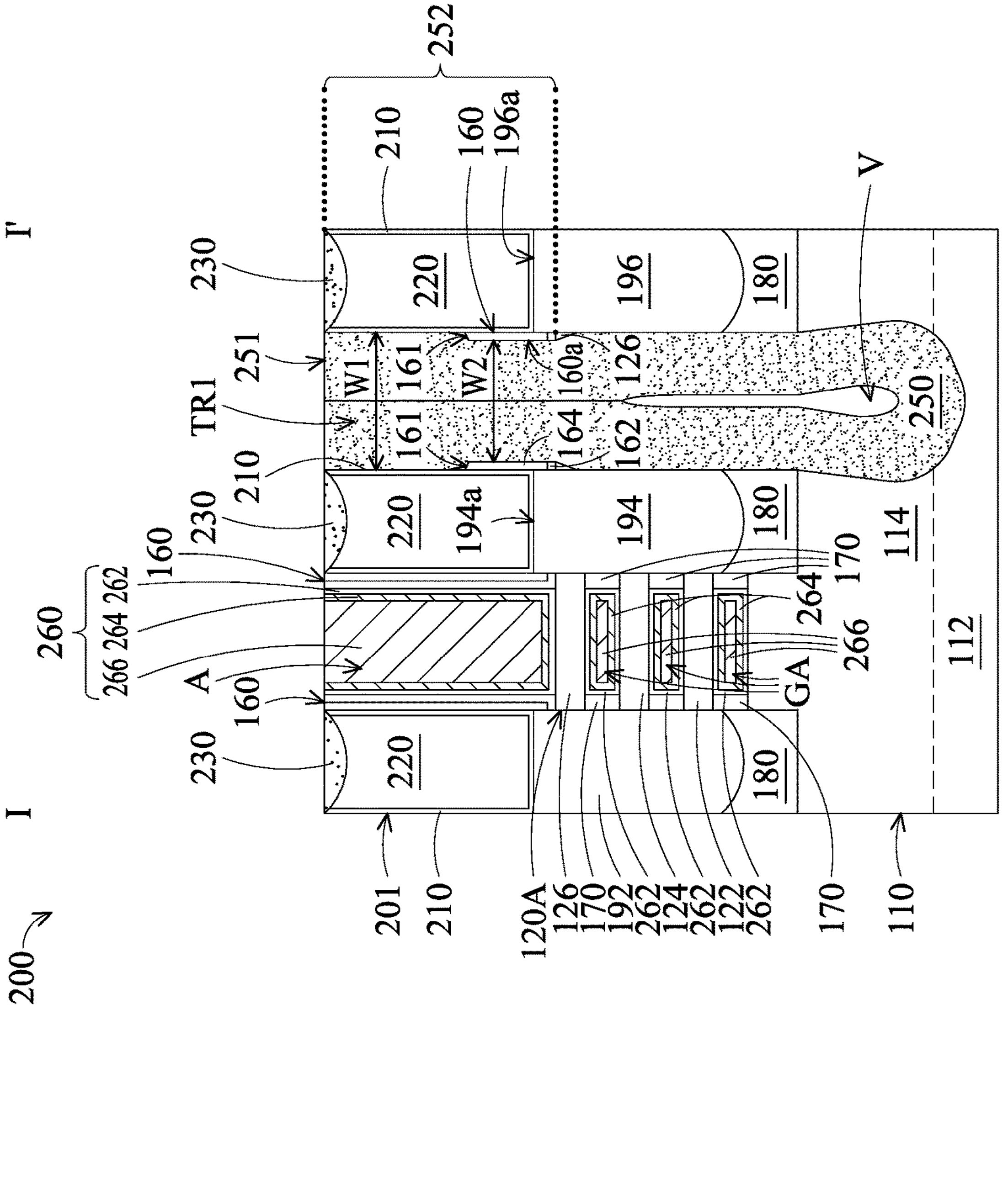
Figures 1, 2P:
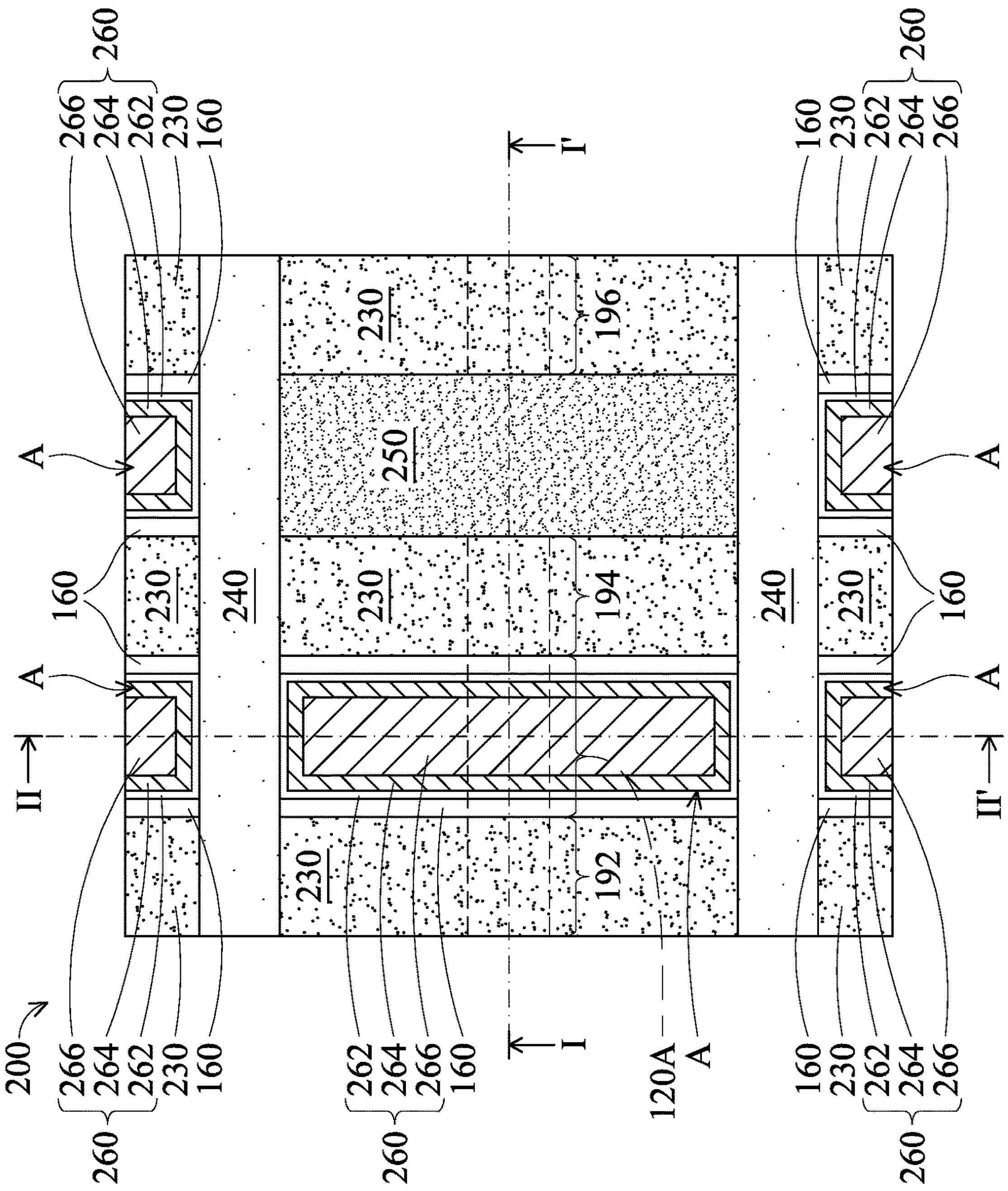
Figures 2, 2P:
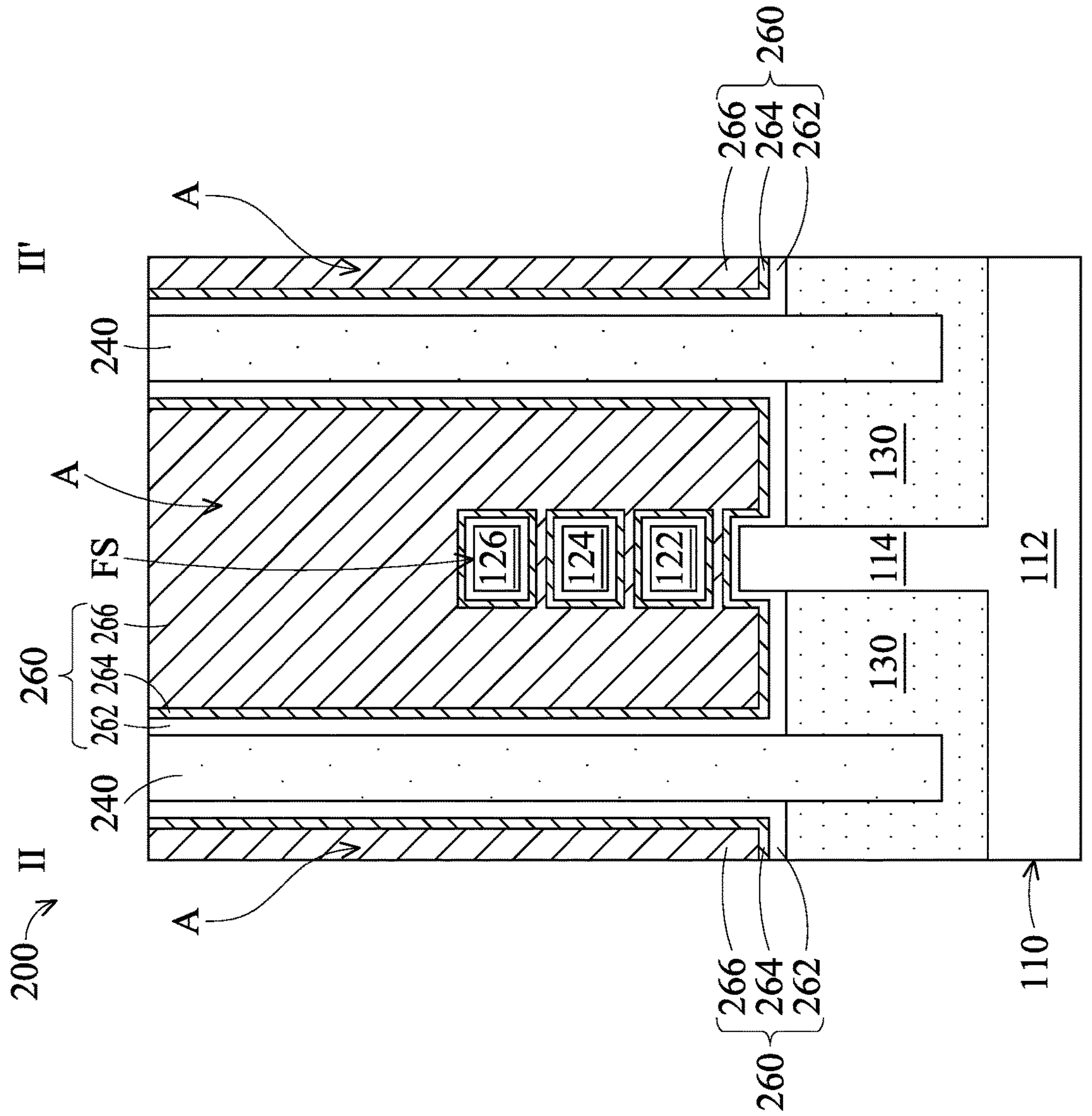

FIGS. 2A-2P are cross-sectional views of various stages of a process for forming a semiconductor device structure, in accordance with some embodiments. After the step of FIG. 2A, as shown in FIG. 2B, portions of the fin structure FS, which are not covered by the gate stacks 140A and 140B and the gate spacer 160, are removed, in accordance with some embodiments. The removal process forms trenches TR in the fin structure FS, in accordance with some embodiments.

As shown in FIG. 2B, the nanostructure stack 120 is divided into nanostructure stacks 120A and 120B by the trenches TR, in accordance with some embodiments. The trenches TR pass through the nanostructure stack 120, in accordance with some embodiments. As shown in FIG. 2B, sidewalls of the nanostructure stack 120A are substantially aligned with (or substantially coplanar with) sidewalls of the gate spacer 160 thereover, in accordance with some embodiments.

Similarly, sidewalls of the nanostructure stack 120B are substantially aligned with (or substantially coplanar with) the sidewalls of the gate spacer 160 thereover, in accordance with some embodiments.

As shown in FIG. 2B, upper portions U1 and U2 of the fin 114 are remained under the gate stacks 140A and 140B and the gate spacer 160 after the removal process, in accordance with some embodiments. The upper portions U1 and U2 are also referred to as channel portions, in accordance with some embodiments.

The removal process includes an etching process, in accordance with some embodiments. The etching process includes an anisotropic etching process such as a dry etching process, in accordance with some embodiments.

As shown in FIG. 2C, portions of the nanostructures 121, 123, and 125 are removed through the trenches TR, in accordance with some embodiments. The removal process forms recesses R1 and R2, in accordance with some embodiments. The recesses R1 are in the nanostructure stack 120A, in accordance with some embodiments. The recesses R2 are in the nanostructure stack 120B, in accordance with some embodiments.

As shown in FIG. 2C, an inner spacer layer 170 is formed in the recesses R1 and R2 of the nanostructure stacks 120A and 120B, in accordance with some embodiments. The inner spacer layer 170 is in direct contact with the nanostructure stacks 120A and 120B, in accordance with some embodiments.

As shown in FIG. 2C, the sidewalls of the inner spacer layer 170 are substantially aligned with (or substantially coplanar with) the sidewalls of the gate spacer 160 thereover, in accordance with some embodiments.

The inner spacer layer 170 is made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

The term "high-k material" means a material having a dielectric constant greater than the dielectric constant of silicon dioxide, in accordance with some embodiments. The term "low-k material" means a material having a dielectric constant less than the dielectric constant of silicon dioxide, in accordance with some embodiments.

In some embodiments, the inner spacer layer 170 is formed using a deposition process and an etching process. The deposition process includes a physical vapor deposition process, a chemical vapor deposition process, an atomic layer deposition process, or the like, in accordance with some embodiments. In some other embodiments, the inner spacer layer 170 is formed using a selective deposition process such as an atomic layer deposition process.

FIG. 2D-1 is a top view of the semiconductor device structure of FIG. 2D, in accordance with some embodiments. FIG. 2D is a cross-sectional view illustrating the semiconductor device structure along a sectional line I-I' in FIG. 2D-1, in accordance with some embodiments. As shown in FIGS. 2D and 2D-1, bottom spacers 180 are formed in the trenches TR and over the fin 114, in accordance with some embodiments.

The bottom spacers 180 are made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

In some embodiments, the bottom spacers 180 are formed using a deposition process and an etching process. The deposition process includes a physical vapor deposition process, a chemical vapor deposition process, an atomic layer deposition process, or the like, in accordance with some embodiments. In some other embodiments, the bottom spacers 180 are formed using a selective deposition process such as an atomic layer deposition process.

As shown in FIGS. 2D and 2D-1, source/drain structures 192, 194, and 196 are formed in the trenches TR and over the bottom spacers 180, in accordance with some embodiments. The nanostructure stack 120A and the upper portion U1 of the fin 114 are between the source/drain structures 192 and 194, in accordance with some embodiments.

The nanostructure stack 120B and the upper portion U2 of the fin 114 are between the source/drain structures 194 and 196, in accordance with some embodiments. The source/drain structures 192 and 194 are in direct contact with the nanostructures 122, 124, and 126 of the nanostructure stack 120A, the gate spacer 160, and the inner spacer layer 170, in accordance with some embodiments.

The source/drain structures 194 and 196 are in direct contact with the nanostructures 122, 124, and 126 of the nanostructure stack 120B, the gate spacer 160, and the inner spacer layer 170, in accordance with some embodiments. The source/drain structures 192, 194, and 196 are also referred to as stressor structures, in accordance with some embodiments.

In some embodiments, the source/drain structures 192, 194, and 196 are made of a semiconductor material and N-type dopants. The source/drain structures 192, 194, and 196 are in-situ doped with or implanted with N-type dopants, in accordance with some embodiments. The N-type dopants include the Group VA element, in accordance with some embodiments. The Group VA element includes phosphor (P), antimony (Sb), or another suitable Group VA material.

In some embodiments, a concentration of the Group VA element ranges from about 1E20 atoms/$cm^3$ to about 5E20 atoms/$cm^3$. In some embodiments, the atomic percentage of the Group VA element in the source/drain structures 192, 194, and 196 ranges from about 1% to about 5%. The source/drain structures 192, 194, and 196 are also referred to as doped structures, in accordance with some embodiments.

In some embodiments, the source/drain structures 192, 194, and 196 are made of a semiconductor material (e.g., silicon germanium) with P-type dopants, such as the Group IIIA element, in accordance with some embodiments. The Group IIIA element includes boron or another suitable material. The source/drain structures 192, 194, and 196 are formed using an epitaxial process, in accordance with some embodiments.

As shown in FIGS. 2D and 2D-1, an etch stop layer 210 is formed over the source/drain structures 192, 194, and 196 and the isolation layer 130, in accordance with some embodiments. The etch stop layer 210 surrounds the gate stacks 140A and 140B, in accordance with some embodiments. The etch stop layer 210 is made of a nitride-containing material, such as silicon nitride or silicon oxynitride, in accordance with some embodiments.

As shown in FIGS. 2D and 2D-1, a dielectric layer 220 is formed over the etch stop layer 210, in accordance with some embodiments. The dielectric layer 220 surrounds the gate stacks 140A and 140B, in accordance with some embodiments. The etch stop layer 210 and the dielectric layer 220 together form a dielectric structure 201, in accordance with some embodiments. The dielectric structure 201 surrounds the gate stacks 140A and 140B, in accordance with some embodiments.

The etch stop layer 210 and the dielectric layer 220 are made of different materials, in accordance with some embodiments. The dielectric layer 220 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 220 is formed by a deposition process (e.g., a chemical vapor deposition process) and a planarization process (e.g., a chemical mechanical polishing process), in accordance with some embodiments. The planarization process may also remove the mask layer 150 and the upper portions of the gate spacer 160.

As shown in FIG. 2D, upper portions of the dielectric structure 201 are removed to form recesses R in the dielectric structure 201, in accordance with some embodiments. The removal process includes an etching process such as a dry etching process, in accordance with some embodiments.

As shown in FIGS. 2D and 2D-1, a protection layer 230 is formed in the recesses R of the dielectric structure 201, in accordance with some embodiments. The protection layer 230 is used to protect the dielectric layer 220 from damage during subsequent processes, in accordance with some embodiments.

The protection layer 230 and the dielectric layer 220 are made of different materials, in accordance with some embodiments. The protection layer 230 is made of a nitride-containing material (e.g., silicon nitride), an oxynitride-containing material (e.g., silicon oxynitride), or the like, in accordance with some embodiments.

The protection layer 230 is formed by a deposition process (e.g., a chemical vapor deposition process) and a planarization process (e.g., a chemical mechanical polishing process), in accordance with some embodiments.

FIG. 2E-1 is a top view of the semiconductor device structure of FIG. 2E, in accordance with some embodiments. FIG. 2E is a cross-sectional view illustrating the semiconductor device structure along a sectional line I-I' in FIG. 2E-1, in accordance with some embodiments. FIG. 2E-2 is a cross-sectional view illustrating the semiconductor device structure along a sectional line II-II' in FIG. 2E-1, in accordance with some embodiments.

As shown in FIGS. 2E, 2E-1, and 2E-2, portions of the gate stacks 140A and 140B, the dielectric structure 201, the protection layer 230, and the isolation layer 130 are removed to form trenches C passing through the gate stacks 140A and 140B, in accordance with some embodiments.

The gate stack 140A is divided into gate stacks 141A, 142A, and 143A by the trenches C, in accordance with some embodiments. The gate stack 140B is divided into gate stacks 141B, 142B, and 143B by the trenches C, in accordance with some embodiments.

The removal process includes an etching process, in accordance with some embodiments. The etching process includes an anisotropic etching process such as a dry etching process, in accordance with some embodiments.

As shown in FIGS. 2E, 2E-1, and 2E-2, gate-cut structures 240 are formed in the trenches C, in accordance with some embodiments. The trenches C are filled up with the gate-cut structures 240, in accordance with some embodiments. The gate-cut structures 240 are also referred to as poly gate-cut structures, in accordance with some embodiments.

The gate-cut structures 240 are made of a nitride-containing material (e.g., silicon nitride), an oxynitride-containing material (e.g., silicon oxynitride), or the like, in accordance with some embodiments. The gate-cut structures 240 are formed by a deposition process (e.g., a chemical vapor deposition process) and a planarization process (e.g., a chemical mechanical polishing process), in accordance with some embodiments.

FIG. 2F-1 is a top view of the semiconductor device structure of FIG. 2F, in accordance with some embodiments. FIG. 2F is a cross-sectional view illustrating the semiconductor device structure along a sectional line I-I' in FIG. 2F-1, in accordance with some embodiments.

As shown in FIGS. 2F and 2F-1, a mask layer M1 is formed over the protection layer 230, the dielectric structure 201, the gate spacer 160, and the gate stacks 140A and 140B, in accordance with some embodiments. The mask layer M1 has an opening OP, in accordance with some embodiments.

The opening OP exposes the gate stack 142B, in accordance with some embodiments. The mask layer M1 is made of a polymer material (e.g., a photoresist material), nitrides (e.g., silicon nitride), or oxynitride (e.g., silicon oxynitride), in accordance with some embodiments.

As shown in FIG. 2G, an upper portion of the gate stack 142B is removed through the opening OP1 of the mask layer M1, in accordance with some embodiments. Specifically, upper portions of the layer 162 of the gate spacer 160 and an upper portion of the gate electrode 143*b* of the gate stack 142B are removed, in accordance with some embodiments. The remaining gate electrode 143*b* has a concave top surface 143*b*1, in accordance with some embodiments.

The removal process forms a trench TR1 in the gate spacer 160 and the dielectric structure 201, in accordance with some embodiments. The trench TR1 exposes upper portions 160*u* of the gate spacer 160, in accordance with some embodiments. The removal process includes an etching process such as a dry etching process, in accordance with some embodiments.

As shown in FIG. 2H, a mask layer M2 is formed over the mask layer M1 and the gate spacer 160, in accordance with some embodiments. The mask layer M2 is used to protect the mask layer M1 from damage during subsequent processes, in accordance with some embodiments. The mask layer M2 has an opening OP2 in the opening OP1 of the mask layer M1, in accordance with some embodiments. The mask layer M2 has an overhang portion M2*a* surrounding the opening OP2, in accordance with some embodiments.

The mask layers M1 and M2 are made of different materials, in accordance with some embodiments. The mask layer M2 is made of a polymer material, in accordance with some embodiments. The mask layer M2 is formed by a selective deposition process such as a chemical vapor deposition process, in accordance with some embodiments.

In the selective deposition process, the vertical deposition rate of the mask layer M2 is greater than the horizontal deposition rate of the mask layer M2, in accordance with some embodiments. Therefore, the thickness T1 of the mask layer M2 over the top surface of the mask layer M1 is greater than the thickness T2 of the mask layer M2 covering the gate spacer 160, in accordance with some embodiments.

The pressure of the selective deposition process ranges from about 60 mT to about 100 mT, in accordance with some embodiments. The process gas of the selective deposition process includes $N_2$ and $CH_4$, in accordance with some embodiments.

As shown in FIG. 2I, the overhang portion M2*a* of the mask layer M2 is removed, in accordance with some embodiments. The removal process includes an etching process such as a sputtering process, in accordance with some embodiments. The process gas of the sputtering process includes Ar, in accordance with some embodiments.

As shown in FIG. 2I, the mask layer M2 is thinned, in accordance with some embodiments. The lower portion of the mask layer M2 covering the gate spacer 160 is removed after the thinning process, in accordance with some embodiments. The pressure of the thinning process ranges from about 1 mT to about 10 mT, in accordance with some embodiments. The process gas of the thinning process includes $CF_4$, in accordance with some embodiments.

As shown in FIGS. 2I and 2J, the upper portion 160*u* of the gate spacer 160 is removed while the lower portion of the gate stack 142B covers the lower portion 160*a* of the gate spacer 160, in accordance with some embodiments. After the removal process, the upper portions of the inner walls 201*a* of the dielectric structure 201 are exposed, in accordance with some embodiments.

The removal process includes an etching process such as a plasma etching process, in accordance with some embodiments. The process gas of the plasma etching process includes $CF_4$, in accordance with some embodiments.

As shown in FIG. 2K, the lower portion of the gate electrode 143*b* is removed, in accordance with some embodiments. The lower portion 160*a* of the gate spacer 160 is remained after the removal process, in accordance with some embodiments. The removal process includes an etching process such as a dry etching process, in accordance with some embodiments.

As shown in FIG. 2L, the mask layer M2 is removed, in accordance with some embodiments. The removal process includes an ashing process or the like, in accordance with some embodiments.

As shown in FIG. 2L, the gate dielectric layer 141*b* is removed, in accordance with some embodiments. The removal process includes an etching process such as a dry etching process, in accordance with some embodiments.

As shown in FIG. 2L, the nanostructure stack 120B, the inner spacer layer 170 in the nanostructure stack 120B, and the fin 114 originally wrapped by the gate stack 142B are removed, in accordance with some embodiments. The trench TR1 passes through the dielectric structure 201 and the fin 114, in accordance with some embodiments. The trench TR1 extends into the base 112, in accordance with some embodiments.

The trench TR1 exposes sidewalls 194*a*, 196*a*, and 182 of the source/drain structures 194 and 196 and the bottom spacers 180, in accordance with some embodiments. In some embodiments, portions of the nanostructure 126 are remained under the lower portion 160*a* of the gate spacer 160.

The removal process includes an etching process, in accordance with some embodiments. The etching process includes an anisotropic etching process such as a dry etching process, in accordance with some embodiments.

The lower portion 160*a* of the gate spacer 160 prevents the etchant of the removal process from damaging the source/drain structures 194 and 196 through the boundaries between the source/drain structure 194 and the dielectric structure 201 and between the source/drain structure 196 and the dielectric structure 201, in accordance with some embodiments.

Since the application removes the upper portion of the gate spacer 160 through the opening OP1 of the mask layer M1, the width of the trench TR1 is increased, which helps the subsequent removal processes of the gate electrode 143*b*, the gate dielectric layer 141*b*, the nanostructure stack 120B, the inner spacer layer 170 in the nanostructure stack 120B, and the fin 114 originally wrapped by the gate stack 142B, in accordance with some embodiments. Therefore, the yield of the subsequent removal processes is improved, which prevents leakage current from flowing between the source/drain structures 194 and 196 through the substrate 110, in accordance with some embodiments.

As shown in FIG. 2M, a dielectric layer 250*a* is deposited over the mask layer M1, the dielectric structure 201, the gate spacer 160, the source/drain structures 194 and 196, the bottom spacers 180, and the substrate 110, in accordance with some embodiments.

The dielectric layer 250*a* is made of a dielectric material such as an oxide-containing material (e.g., silicon oxide), an nitride-containing material (e.g., silicon nitride), or an oxynitride-containing material (e.g., silicon oxynitride), in accordance with some embodiments. The deposition process includes a chemical vapor deposition (CVD) process or a physical vapor deposition (PVD) process, in accordance with some embodiments.

As shown in FIGS. 2M and 2N, the mask layer M1 and the upper portion of the dielectric layer 250*a* are removed, in accordance with some embodiments. A portion of the dielectric layer 250*a* remains in the trench TR1 and forms a dielectric channel-cut structure 250, in accordance with some embodiments. The trench TR1 is filled up with the dielectric channel-cut structure 250, in accordance with some embodiments.

The dielectric channel-cut structure 250 passes through the dielectric structure 201 and the fin 114, in accordance with some embodiments. The dielectric channel-cut structure 250 is in direct contact with the upper portion of the inner walls 201*a* of the dielectric structure 201, in accordance with some embodiments.

The lower portion 160*a* of the gate spacer 160 is embedded in the dielectric channel-cut structure 250, in accordance with some embodiments. The dielectric channel-cut structure 250 covers a top surface 161 and inner walls 165 of the lower portion of the gate spacer 160, in accordance with some embodiments.

The dielectric channel-cut structure 250 is in direct contact with the top surface 161 and the inner walls 165 of the lower portion of the gate spacer 160 and the nanostructure 126 thereunder, in accordance with some embodiments. The dielectric channel-cut structure 250 is in direct contact with the sidewalls 194*a* and 196*a* of the source/drain structures 194 and 196, in accordance with some embodiments.

The upper portion 252 of the dielectric channel-cut structure 250 has a T-like shape, in accordance with some embodiments. There is a void V in the dielectric channel-cut structure 250, in accordance with some embodiments. The void V is filled with air, in accordance with some embodiments.

The removal process includes a planarization process such as a chemical mechanical polishing process, in accordance with some embodiments. The top surfaces 231, 142A1, and 161 of the protection layer 230, the gate stack 142A, and the gate spacer 160 surrounding the gate stack 142A are substantially level with each other after the removal process, in accordance with some embodiments.

FIG. 2O-1 is a top view of the semiconductor device structure of FIG. 2O, in accordance with some embodiments. FIG. 2O is a cross-sectional view illustrating the semiconductor device structure along a sectional line I-I' in FIG. 2O-1, in accordance with some embodiments.

As shown in FIGS. 2F-1, 2O and 2O-1, the gate stacks 140A and 140B are removed, in accordance with some embodiments. The removal process forms trenches A in the gate spacer 160 and the dielectric structure 201 and between the source/drain structures 192, 194, and 196, in accordance with some embodiments.

As shown in FIGS. 2N, 2O, and 2O-1, the nanostructures 121, 123, and 125 are removed through the trenches A to form gaps GA between the fin 114 and the nanostructures 122, 124, and 126, in accordance with some embodiments. The removal process includes an etching process such as a wet etching process or a dry etching process, in accordance with some embodiments.

FIG. 2P-1 is a top view of the semiconductor device structure of FIG. 2P, in accordance with some embodiments. FIG. 2P is a cross-sectional view illustrating the semiconductor device structure along a sectional line I-I' in FIG. 2P-1, in accordance with some embodiments. FIG. 2P-2 is a cross-sectional view illustrating the semiconductor device structure along a sectional line II-II' in FIG. 2P-1, in accordance with some embodiments.

As shown in FIGS. 2P, 2P-1, and 2P-2, gate stacks 260 are formed in the trenches A and the gaps GA between the fin 114 and the nanostructures 122, 124, and 126, in accordance with some embodiments. The trenches A and the gaps GA are filled up with the gate stacks 260, in accordance with some embodiments.

As shown in FIG. 2P-2, the gate stack 260 is wrapped around the fin 114 and the nanostructures 122, 124, and 126, in accordance with some embodiments. As shown in FIG. 2P, the source/drain structure 194 is between the nanostructures 122, 124 and 126 and the dielectric channel-cut structure 250, in accordance with some embodiments.

The lower portion 160*a* of the gate spacer 160 is between the dielectric structure 201 and the dielectric channel-cut structure 250, in accordance with some embodiments. In some embodiments, a top surface 161 of the lower portion 160*a* of the gate spacer 160 is lower than a top surface 251 of the dielectric channel-cut structure 250. The dielectric structure 201 separates the gate stack 260 from the dielectric channel-cut structure 250, in accordance with some embodiments.

Each gate stack 260 includes a gate dielectric layer 262, a work function metal layer 264, and a gate electrode layer 266, in accordance with some embodiments. The gate dielectric layer 262 is formed over the nanostructures 122, 124, and 126, the fin 114, the gate spacer 160, and the inner spacer layer 170, in accordance with some embodiments.

The gate dielectric layer 262 conformally covers the nanostructures 122, 124, and 126, the fin 114, the gate spacer 160, the inner spacer layer 170, and the gate-cut structures 240, in accordance with some embodiments. The gate dielectric layer 262 surrounds the nanostructures 122, 124, and 126, in accordance with some embodiments.

The gate dielectric layer 262 is made of a high-K material, such as $HfO_2$, $La_2O_3$, CaO, $ZrO_2$, $HfZrO_2$, or $Al_2O_3$, in accordance with some embodiments. The gate dielectric layer 262 is formed using an atomic layer deposition process or another suitable deposition process and a planarization process such as a chemical mechanical polishing process.

The work function metal layer 264 is conformally formed over the gate dielectric layer 262, in accordance with some embodiments. The work function metal layer 264 provides a desired work function for transistors to enhance device performance including improved threshold voltage.

In the embodiments of forming an NMOS transistor, the work function metal layer 264 can be a metal capable of providing a work function value suitable for the device, such as equal to or less than about 4.5 eV.

The work function metal layer 264 is made of metal, metal carbide, metal nitride, or a combination thereof, in accordance with some embodiments. For example, the work function metal layer 264 is made of tantalum, hafnium carbide, zirconium carbide, tantalum nitride, or a combination thereof.

In the embodiments of forming a PMOS transistor, the work function metal layer 264 can be a metal capable of providing a work function value suitable for the device, such as equal to or greater than about 4.8 eV.

The work function metal layer 264 is made of metal, metal carbide, metal nitride, another suitable material, or a combination thereof, in accordance with some embodiments. For example, the work function metal layer 264 is made of titanium, titanium nitride, another suitable material, or a combination thereof.

The work function metal layer 264 is formed using a deposition process, in accordance with some embodiments. The deposition process includes a physical vapor deposition process, a chemical vapor deposition process, an atomic layer deposition process, or a combination thereof, in accordance with some embodiments.

The gate electrode layer 266 is formed over the work function metal layer 264, in accordance with some embodiments. The gate electrode layer 266 is made of metal, metal nitride, or metal carbide, in accordance with some embodiments. The gate electrode layer 266 is made of tungsten, titanium nitride, tantalum nitride, titanium aluminide, titanium carbide, or a combination thereof, in accordance with some embodiments.

The gate electrode layer 266 is formed using an atomic layer deposition process, a chemical vapor deposition process, or a physical vapor deposition process, in accordance with some embodiments. In this step, a semiconductor device structure 200 is substantially formed, in accordance with some embodiments.

In some embodiments, the dielectric channel-cut structure 250 has widths W1 and W2. The width W1 is measured at a height ranging from about 15 nm to about 50 nm from the top surface 194*a* or 196*a* of the source/drain structure 194 or 196, in accordance with some embodiments. The width W2 is measured at a height ranging from about 0 nm to about 15 nm from the top surface 194a or 196a of the source/drain structure 194 or 196, in accordance with some embodiments.

The difference between the widths W1 and W2 ranges from about 5 nm to about 30 nm, in accordance with some embodiments. The difference between the widths W1 and W2 ranges from about 5 nm to about 15 nm, in accordance with some embodiments.

The application removes the upper portion of the gate spacer 160 to increase the width of the trench TR1, which improves the yield of the subsequent removal processes and therefore prevents leakage current from flowing between the source/drain structures 194 and 196 through the substrate 110, in accordance with some embodiments. Therefore, the performance and the reliability of the semiconductor device structure 200 are improved, in accordance with some embodiments.

Figure 3A:
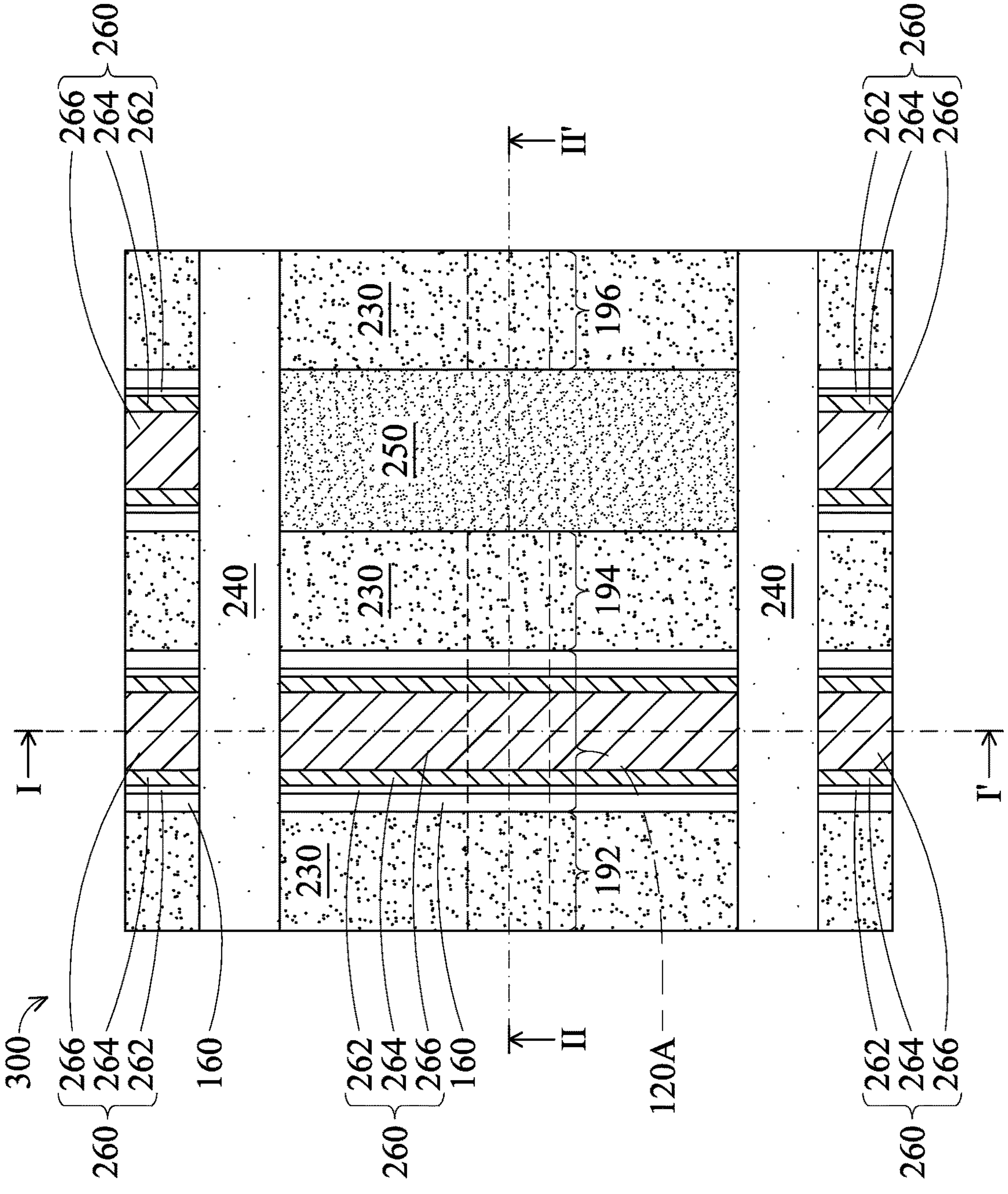
FIG. 3A is a top view of a semiconductor device structure, in accordance with some embodiments.
Figure 3B:
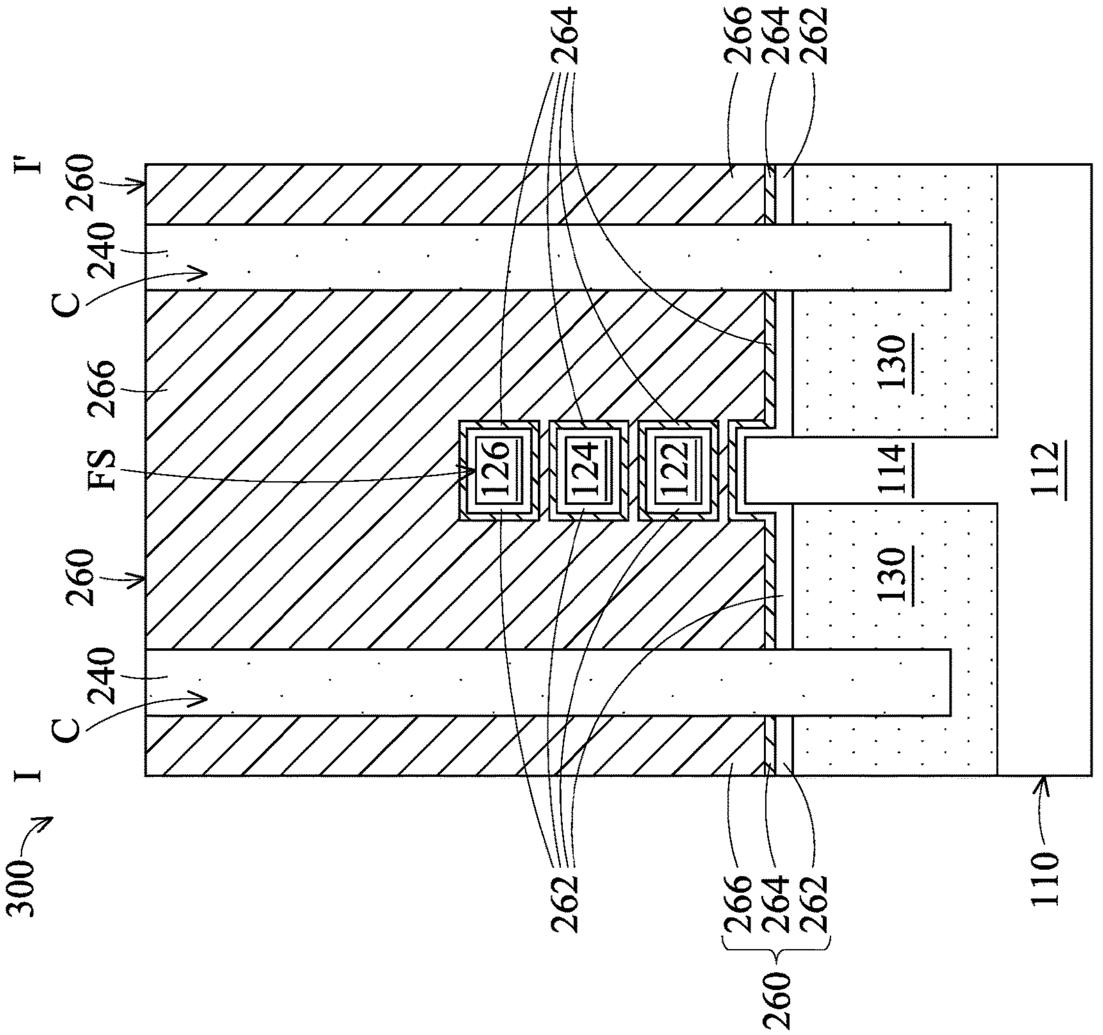
FIG. 3B is a cross-sectional view illustrating the semiconductor device structure along a sectional line I-I' in FIG. 3A, in accordance with some embodiments.
Figure 3C:
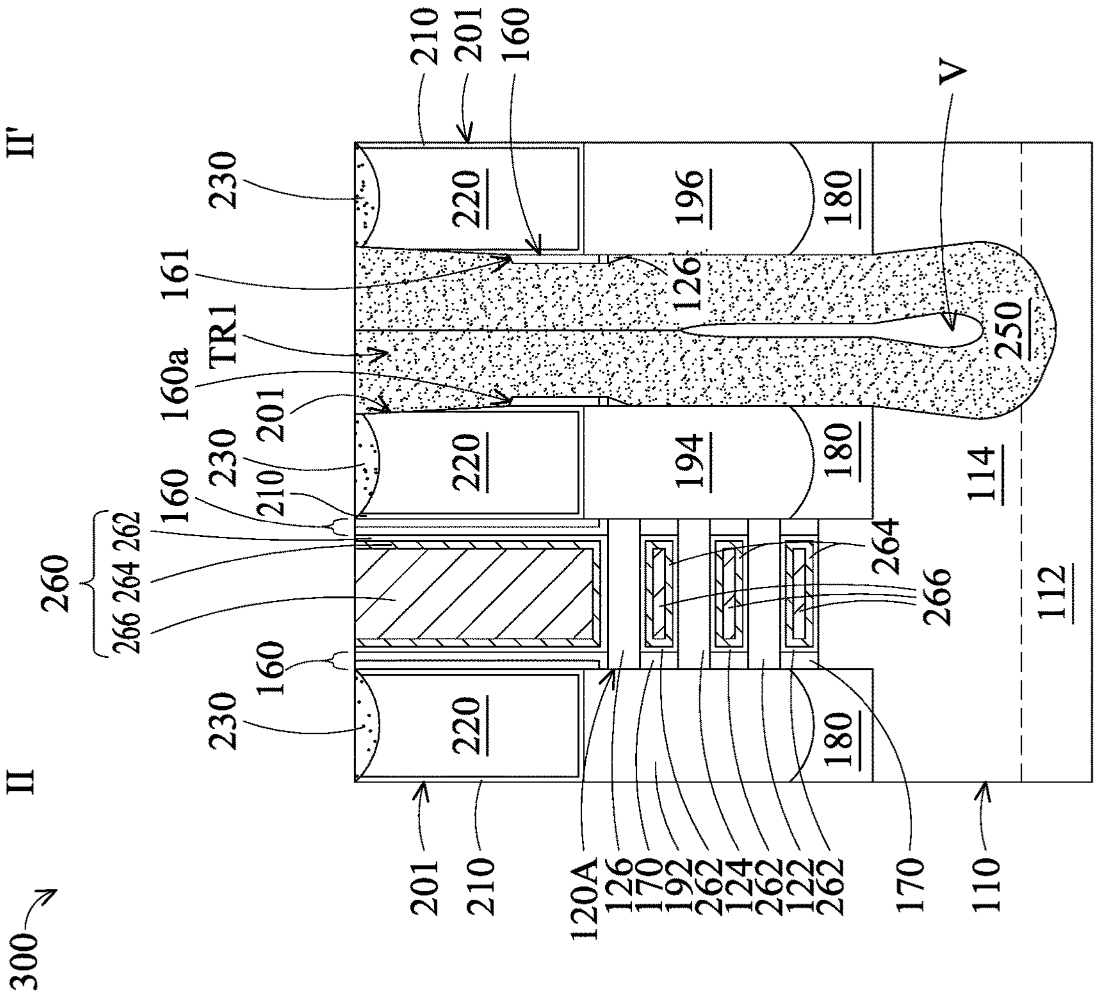
FIG. 3C is a cross-sectional view illustrating the semiconductor device structure along a sectional line II-II' in FIG. 3A, in accordance with some embodiments.

FIG. 3A is a top view of a semiconductor device structure 300, in accordance with some embodiments. FIG. 3B is a cross-sectional view illustrating the semiconductor device structure 300 along a sectional line I-I' in FIG. 3A, in accordance with some embodiments. FIG. 3C is a cross-sectional view illustrating the semiconductor device structure 300 along a sectional line II-II' in FIG. 3A, in accordance with some embodiments.

As shown in FIGS. 3A, 3B, and 3C, the semiconductor device structure 300 is similar to the semiconductor device structure 200 of FIGS. 2P, 2P-1, and 2P-2, except that the gate-cut structures 240 are formed after the gate stacks 260 are formed, in accordance with some embodiments. The gate-cut structures 240 are also referred to as metal gate-cut structures, in accordance with some embodiments.

Specifically, the formation of the gate-cut structures 240 includes partially removing the gate stacks 260, the dielectric structure 201, the protection layer 230, and the isolation layer 130 to form trenches C passing through the gate stacks 260; and filling the gate-cut structures 240 into the trenches C, in accordance with some embodiments.

In some embodiments, the dielectric structure 201 originally covered by the upper portion 160u of the gate spacer 160 of FIG. 2G is partially removed through the trench TR1 during the removal processes of FIGS. 2J-2L. Therefore, the dielectric layer 220 is exposed after the removal processes, in accordance with some embodiments. As a result, the dielectric channel-cut structure 250 is in direct contact with the dielectric layer 220, in accordance with some embodiments.

In some embodiments, the protection layer 230 is partially removed during the removal processes of FIGS. 2J-2L. The dielectric channel-cut structure 250 is in direct contact with the protection layer 230, in accordance with some embodiments.

Figure 4A:
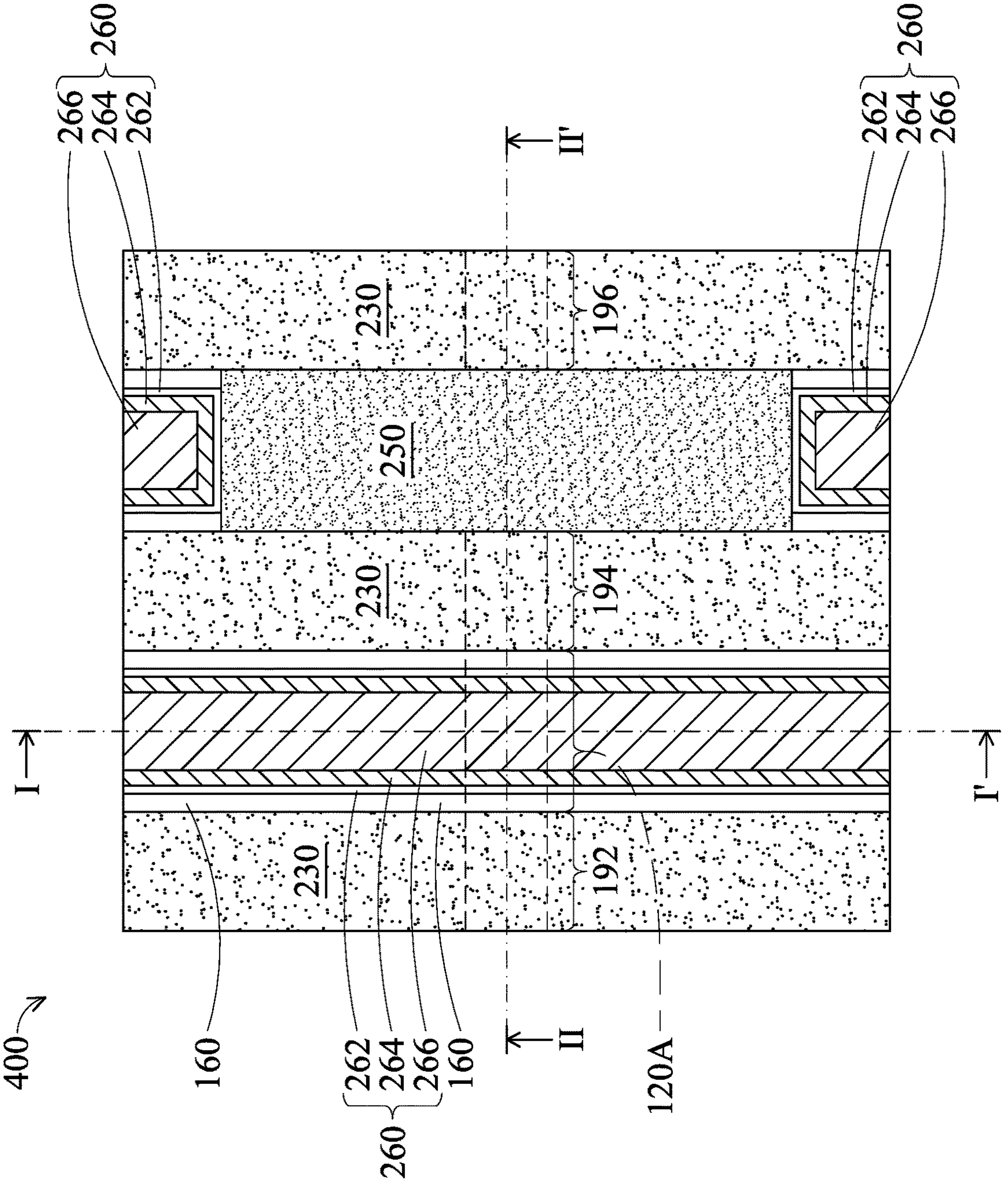
FIG. 4A is a top view of a semiconductor device structure, in accordance with some embodiments.
Figure 4B:
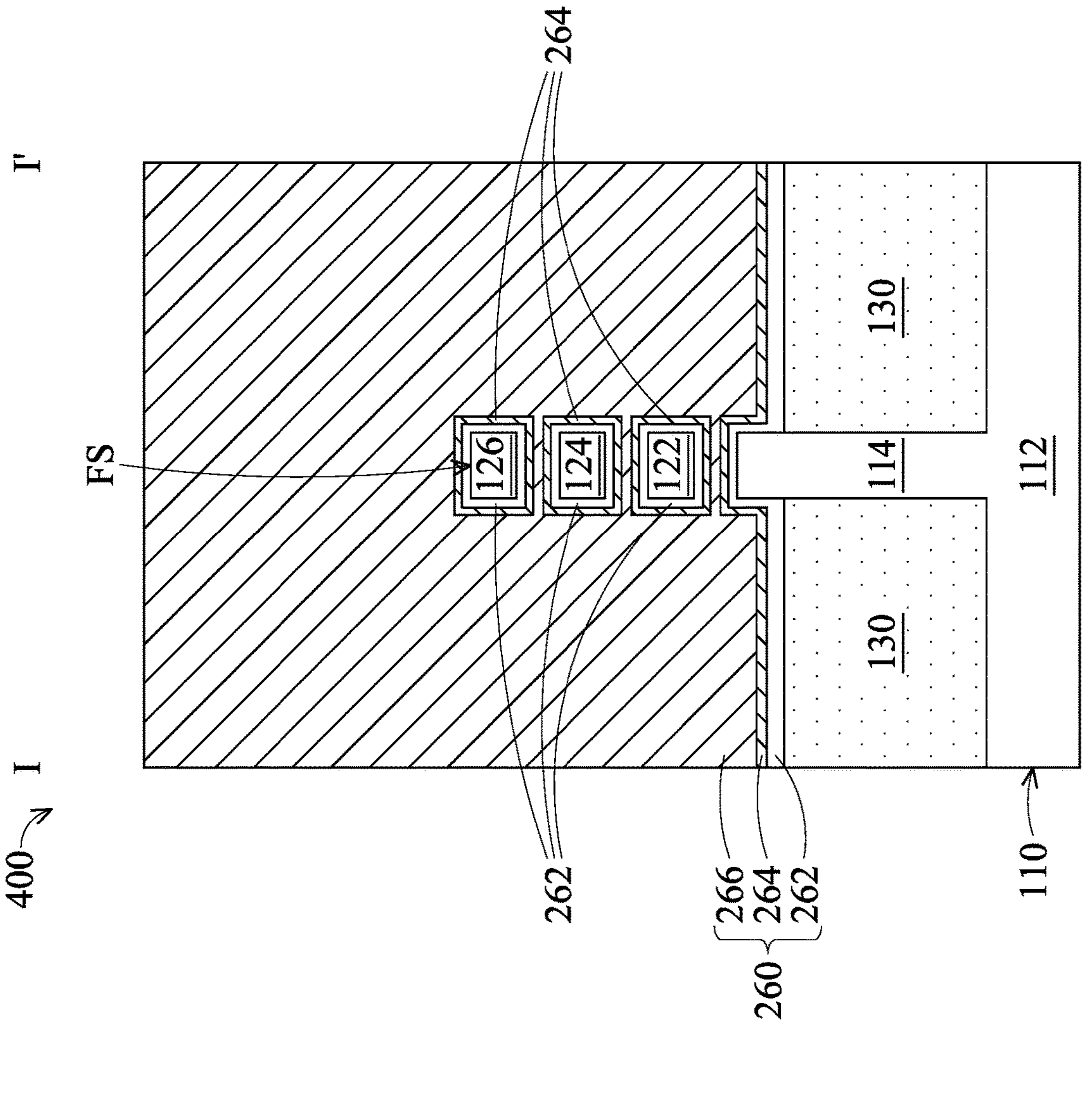
FIG. 4B is a cross-sectional view illustrating the semiconductor device structure along a sectional line I-I' in FIG. 4A, in accordance with some embodiments.
Figure 4C:
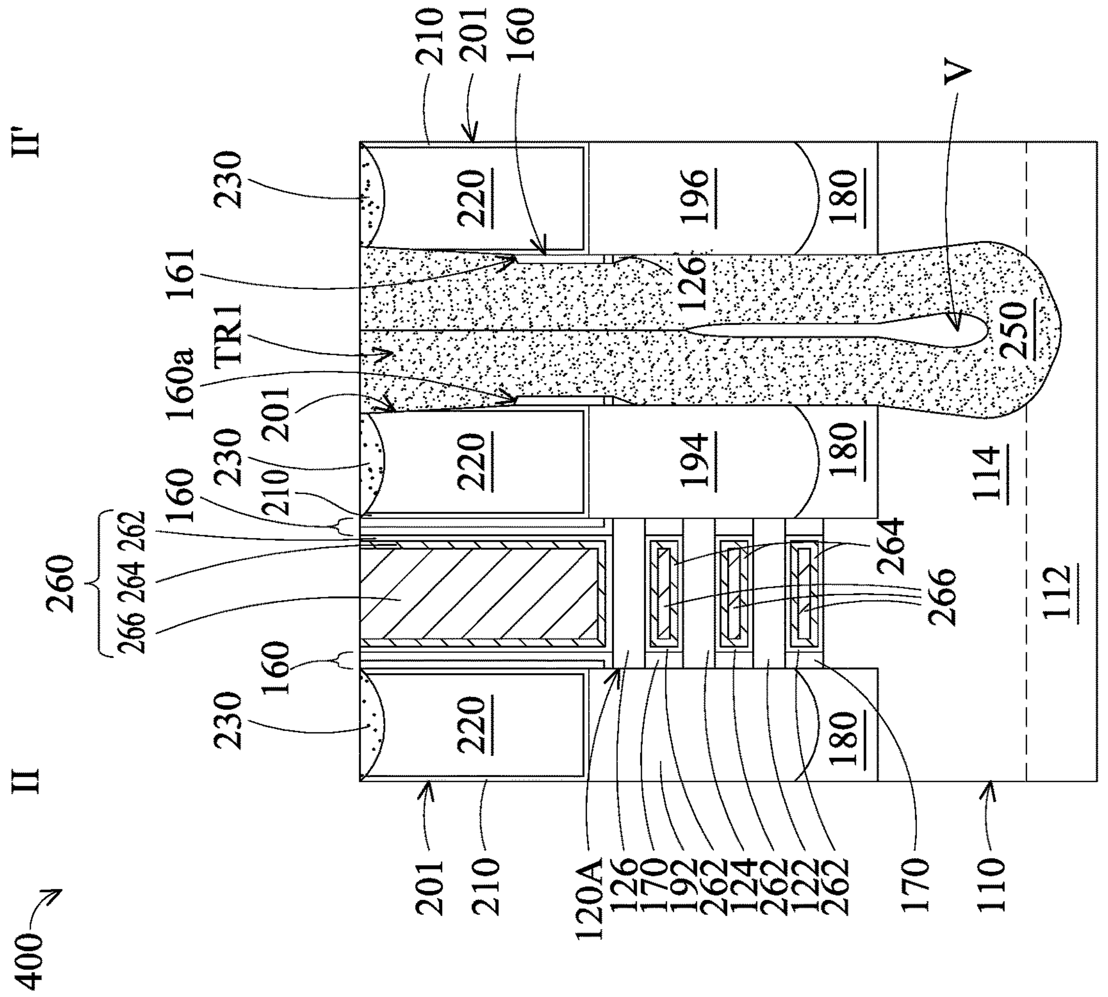
FIG. 4C is a cross-sectional view illustrating the semiconductor device structure along a sectional line II-II' in FIG. 4A, in accordance with some embodiments.

FIG. 4A is a top view of a semiconductor device structure 400, in accordance with some embodiments. FIG. 4B is a cross-sectional view illustrating the semiconductor device structure 400 along a sectional line I-I' in FIG. 4A, in accordance with some embodiments. FIG. 4C is a cross-sectional view illustrating the semiconductor device structure 400 along a sectional line II-II' in FIG. 4A, in accordance with some embodiments.

As shown in FIGS. 4A, 4B, and 4C, the semiconductor device structure 400 is similar to the semiconductor device structure 300 of FIGS. 3A, 3B, and 3C, except that the semiconductor device structure 400 does not have the gate-cut structures 240, in accordance with some embodiments.

Processes and materials for forming the semiconductor device structure 300 may be similar to, or the same as, those for forming the semiconductor device structure 200 described above. Elements designated by the same or similar reference numbers as those in FIGS. 1A to 3C have the same or similar structures and the materials. Therefore, the detailed descriptions thereof will not be repeated herein.

In accordance with some embodiments, semiconductor device structures and methods for forming the same are provided. The methods (for forming the semiconductor device structure) include removing an upper portion of a gate stack to form a trench exposing an upper portion of a gate spacer; removing the upper portion of the gate spacer to widen the trench; removing a lower portion of the gate stack and a portion of a fin under the gate stack through the trench; and forming a dielectric channel-cut structure in the trench. Since the trench is widened, the yield of the subsequent removal processes of the lower portion of the gate stack and the portion of the fin under the gate stack is improved. Therefore, the methods prevent leakage current from flowing between source/drain structures, which are on opposite sides of the gate stack, through a substrate. Therefore, the performance and the reliability of the semiconductor device structures are improved.

In accordance with some embodiments, a method for forming a semiconductor device structure is provided. The method includes providing a substrate having a base and a fin over the base. The method includes forming a first gate stack wrapped around the fin. The method includes forming a first gate spacer over a first sidewall of the first gate stack. The method includes partially removing the fin, which is not covered by the first gate stack and the first gate spacer, to form a first trench and a second trench in the fin. The first gate stack is between the first trench and the second trench. The method includes forming a first source/drain structure and a second source/drain structure over the first trench and the second trench respectively. The method includes forming a dielectric structure over the base, the first source/drain structure, and the second source/drain structure and surrounding the first gate stack. The method includes removing a first upper portion of the first gate stack to expose a second upper portion of the first gate spacer. The method includes removing the second upper portion of the first gate spacer. The method includes removing a first lower portion of the first gate stack and the fin originally wrapped by the first gate stack to form a third trench passing through the dielectric structure and the fin. The method includes forming a dielectric channel-cut structure in the trench.

In accordance with some embodiments, a method for forming a semiconductor device structure is provided. The method includes providing a substrate and a nanostructure stack over the substrate. The method includes forming a first gate stack wrapped around the nanostructure stack. The method includes forming a first gate spacer over a first sidewall of the first gate stack. The method includes partially removing the nanostructure stack, which is not covered by the first gate stack and the first gate spacer, to form a first trench and a second trench passing through the nanostructure stack. The method includes forming a first source/drain structure and a second source/drain structure in the first trench and the second trench respectively. The method includes forming a dielectric structure over the substrate, the first source/drain structure, and the second source/drain structure and surrounding the first gate stack. The method includes partially removing the first gate stack to expose a first upper portion of the first gate spacer. The method includes removing the first upper portion of the first gate spacer while a first lower portion of the first gate stack covers a second lower portion of the first gate spacer. The method includes removing the remaining first gate stack and the nanostructure stack originally wrapped by the first gate stack to form a third trench passing through the dielectric structure and the nanostructure stack. The method includes forming a dielectric channel-cut structure in the trench.

In accordance with some embodiments, a semiconductor device structure is provided. The semiconductor device structure includes a substrate having a base and a fin over the base. The semiconductor device structure includes a gate stack wrapped around the fin. The semiconductor device structure includes a dielectric channel-cut structure passing through the fin. The semiconductor device structure includes a source/drain structure between the gate stack and the dielectric channel-cut structure. The semiconductor device structure includes a dielectric structure over the source/drain structure and separating the gate stack from the dielectric channel-cut structure. The semiconductor device structure includes a gate spacer between the dielectric structure and the dielectric channel-cut structure. The gate spacer is embedded in the dielectric channel-cut structure, and a first top surface of the gate spacer is lower than a second top surface of the dielectric channel-cut structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

providing a substrate having a base and a fin over the base;

forming a first gate stack wrapped around the fin;

forming a first gate spacer over a first sidewall of the first gate stack;

partially removing the fin, which is not covered by the first gate stack and the first gate spacer, to form a first trench and a second trench in the fin, wherein the first gate stack is between the first trench and the second trench;

forming a first source/drain structure and a second source/drain structure over the first trench and the second trench respectively;

forming a dielectric structure over the base, the first source/drain structure, and the second source/drain structure and surrounding the first gate stack;

removing a first upper portion of the first gate stack to expose a second upper portion of the first gate spacer;

removing the second upper portion of the first gate spacer;

removing a first lower portion of the first gate stack and the fin originally wrapped by the first gate stack to form a third trench passing through the dielectric structure and the fin; and forming a dielectric channel-cut structure in the third trench.

2. The method for forming the semiconductor device structure as claimed in claim 1, wherein a second lower portion of the first gate spacer is remained after the first lower portion of the first gate stack is removed.

3. The method for forming the semiconductor device structure as claimed in claim 2, wherein the second lower portion of the first gate spacer is embedded in the dielectric channel-cut structure.

4. The method for forming the semiconductor device structure as claimed in claim 1, wherein a third upper portion of an inner wall of the dielectric structure is exposed after the second upper portion of the first gate spacer is removed.

5. The method for forming the semiconductor device structure as claimed in claim 4, wherein the dielectric channel-cut structure is in direct contact with the third upper portion of the inner wall of the dielectric structure.

6. The method for forming the semiconductor device structure as claimed in claim 1, wherein the third trench exposes a second sidewall of the first source/drain structure, and the dielectric channel-cut structure is in direct contact with the second sidewall of the first source/drain structure.

7. The method for forming the semiconductor device structure as claimed in claim 1, wherein the removing of the first lower portion of the first gate stack and the fin originally wrapped by the first gate stack further comprising:

partially removing the dielectric structure originally covered by the second upper portion of the first gate spacer.

8. The method for forming the semiconductor device structure as claimed in claim 1, further comprising:

forming a second gate stack wrapped around the fin;

forming a second gate spacer over a second sidewall of the second gate stack;

partially removing the fin, which is not covered by the second gate stack and the second gate spacer, to form a fourth trench in the fin; and forming a third source/drain structure over the fourth trench, wherein the second gate stack is between the first source/drain structure and the third source/drain structure, and the dielectric structure is further formed over the third source/drain structure and surrounds the second gate stack.

9. The method for forming the semiconductor device structure as claimed in claim 1, wherein the first lower portion of the first gate stack has a concave top surface.

10. The method for forming the semiconductor device structure as claimed in claim 1, wherein the dielectric channel-cut structure covers a top surface of a second lower portion of the first gate spacer.

11. A method for forming a semiconductor device structure, comprising:

providing a substrate and a nanostructure stack over the substrate;

forming a first gate stack wrapped around the nanostructure stack;

forming a first gate spacer over a first sidewall of the first gate stack;

partially removing the nanostructure stack, which is not covered by the first gate stack and the first gate spacer, to form a first trench and a second trench passing through the nanostructure stack;

forming a first source/drain structure and a second source/drain structure in the first trench and the second trench respectively;

forming a dielectric structure over the substrate, the first source/drain structure, and the second source/drain structure and surrounding the first gate stack;

partially removing the first gate stack to expose a first upper portion of the first gate spacer;

removing the first upper portion of the first gate spacer while a first lower portion of the first gate stack covers a second lower portion of the first gate spacer;

removing the remaining first gate stack and the nanostructure stack originally wrapped by the first gate stack to form a third trench passing through the dielectric structure and the nanostructure stack; and forming a dielectric channel-cut structure in the trench.

12. The method for forming the semiconductor device structure as claimed in claim 11, wherein the removing of the remaining first gate stack and the nanostructure stack originally wrapped by the first gate stack further comprising:

partially removing the dielectric structure originally covered by the first upper portion of the first gate spacer.

13. The method for forming the semiconductor device structure as claimed in claim 12, further comprising:

removing a second upper portion of the dielectric structure to form a recess in the dielectric structure before the first gate stack is partially removed; and forming a protection layer in the recess.

14. The method for forming the semiconductor device structure as claimed in claim 13, wherein the removing of the remaining first gate stack and the nanostructure stack originally wrapped by the first gate stack further comprising:

partially removing the protection layer.

15. The method for forming the semiconductor device structure as claimed in claim 11, wherein a second upper portion of the dielectric channel-cut structure has a T-like shape.

16. A semiconductor device structure, comprising:

a substrate having a base and a fin over the base;

a gate stack wrapped around the fin;

a dielectric channel-cut structure passing through the fin;

a source/drain structure between the gate stack and the dielectric channel-cut structure;

a dielectric structure over the source/drain structure and separating the gate stack from the dielectric channel-cut structure; and a gate spacer between the dielectric structure and the dielectric channel-cut structure, wherein the gate spacer is embedded in the dielectric channel-cut structure, and a first top surface of the gate spacer is lower than a second top surface of the dielectric channel-cut structure.

17. The semiconductor device structure as claimed in claim 16, wherein the dielectric channel-cut structure is in direct contact with the dielectric structure.

18. The semiconductor device structure as claimed in claim 16, further comprising:

a protection layer embedded in a top portion of the dielectric structure, and the dielectric channel-cut structure is in direct contact with the protection layer.

19. The semiconductor device structure as claimed in claim 16, wherein the dielectric channel-cut structure is in direct contact with the first top surface and an inner wall of the gate spacer.

20. The semiconductor device structure as claimed in claim 16, further comprising:

a nanostructure over the fin, wherein the gate stack is further wrapped around the nanostructure, and the source/drain structure is further between the nanostructure and the dielectric channel-cut structure.

* * * * *